(12) United States Patent
Su et al.

(10) Patent No.:  US 12,635,208 B2
(45) Date of Patent:  May 19, 2026

(54) METHOD FOR FORMING SEMICONDUCTOR DEVICE STRUCTURE WITH GATE STACK

(71) Applicant: Taiwan Semiconductor Manufacturing Company, Ltd., Hsinchu (TW)

(72) Inventors: Huan-Chieh Su, Changhua County (TW); Chun-Yuan Chen, HsinChu (TW); Lin-Yu Huang, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 853 days.

(21) Appl. No.: 17/810,697

(22) Filed: Jul. 5, 2022

(65) Prior Publication Data

US 2024/0014041 A1      Jan. 11, 2024

(51) Int. Cl.
| | |
|---|---|
| *H01L 21/28* | (2025.01) |
| *H01L 21/02* | (2006.01) |
| *H01L 21/764* | (2006.01) |
| *H10D 30/01* | (2025.01) |
| *H10D 30/43* | (2025.01) |
| *H10D 30/67* | (2025.01) |
| *H10D 62/10* | (2025.01) |
(Continued)

(52) U.S. Cl.
CPC .. *H01L 21/28123* (2013.01); *H01L 21/02603* (2013.01); *H01L 21/764* (2013.01); *H10D 30/014* (2025.01); *H10D 30/031* (2025.01);

*H10D 30/43* (2025.01); *H10D 30/6735* (2025.01); *H10D 30/6757* (2025.01); *H10D 62/115* (2025.01); *H10D 62/121* (2025.01); *H10D 84/0128* (2025.01); *H10D 84/0135* (2025.01); *H10D 84/0151* (2025.01); *H10D 84/038* (2025.01); *H10D 84/83* (2025.01)

(58) Field of Classification Search
CPC ............ H01L 21/28123; H10D 62/115; H10D 84/0128; H10D 84/0135; H10D 84/0151
See application file for complete search history.

(56) References Cited

U.S. PATENT DOCUMENTS 9,209,247 B2    12/2015  Colinge et al.
9,236,267 B2    1/2016   De et al.
(Continued)

*Primary Examiner* — Jacob Y Choi
*Assistant Examiner* — Aaron Michael Wegner
(74) *Attorney, Agent, or Firm* — McClure, Qualey & Rodack, LLP

(57)                      ABSTRACT

A method for forming a semiconductor device structure is provided. The method includes providing a substrate, a nanostructure, an isolation structure, an isolation fin, and a gate stack. The method includes turning the substrate upside down and removing the base to expose the isolation structure. The method includes partially removing the isolation structure to form a first trench in the isolation structure. The first trench exposes a portion of the isolation fin. The method includes removing the portion of the isolation fin through the first trench to form a second trench in the gate stack. The method includes partially removing the gate stack through the first trench and the second trench. The second trench passes through the gate stack and divides the gate stack into a first part and a second part.

20 Claims, 45 Drawing Sheets

(51) Int. Cl.
  *H10D 84/01*      (2026.01)
  *H10D 84/03*      (2025.01)
  *H10D 84/83*      (2025.01)

(56)            References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2019/0148215 | A1* | 5/2019 | Chang .................. H10D 62/115 257/369 |
| 2020/0266192 | A1* | 8/2020 | Ju ......................... H10D 84/834 |
| 2020/0294998 | A1* | 9/2020 | Lilak ..................... H01L 23/535 |
| 2022/0262915 | A1* | 8/2022 | Su ......................... H10D 30/031 |
| 2022/0302109 | A1* | 9/2022 | Kim ...................... H10D 84/83 |
| 2022/0392896 | A1* | 12/2022 | Guler ................... H10D 84/038 |
| 2022/0415890 | A1* | 12/2022 | Hasan ................ H10D 84/0193 |

* cited by examiner

METHOD FOR FORMING SEMICONDUCTOR DEVICE STRUCTURE WITH GATE STACK

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2D-1 to 2J-1 are cross-sectional views illustrating the semiconductor device structure along a sectional line I-I' in FIGS. 2D-2J, in accordance with some embodiments.

FIG. 3B is a cross-sectional view illustrating the semiconductor device structure along a sectional line I-I' in FIG. 3A, in accordance with some embodiments.

DETAILED DESCRIPTION

Figure 1A:
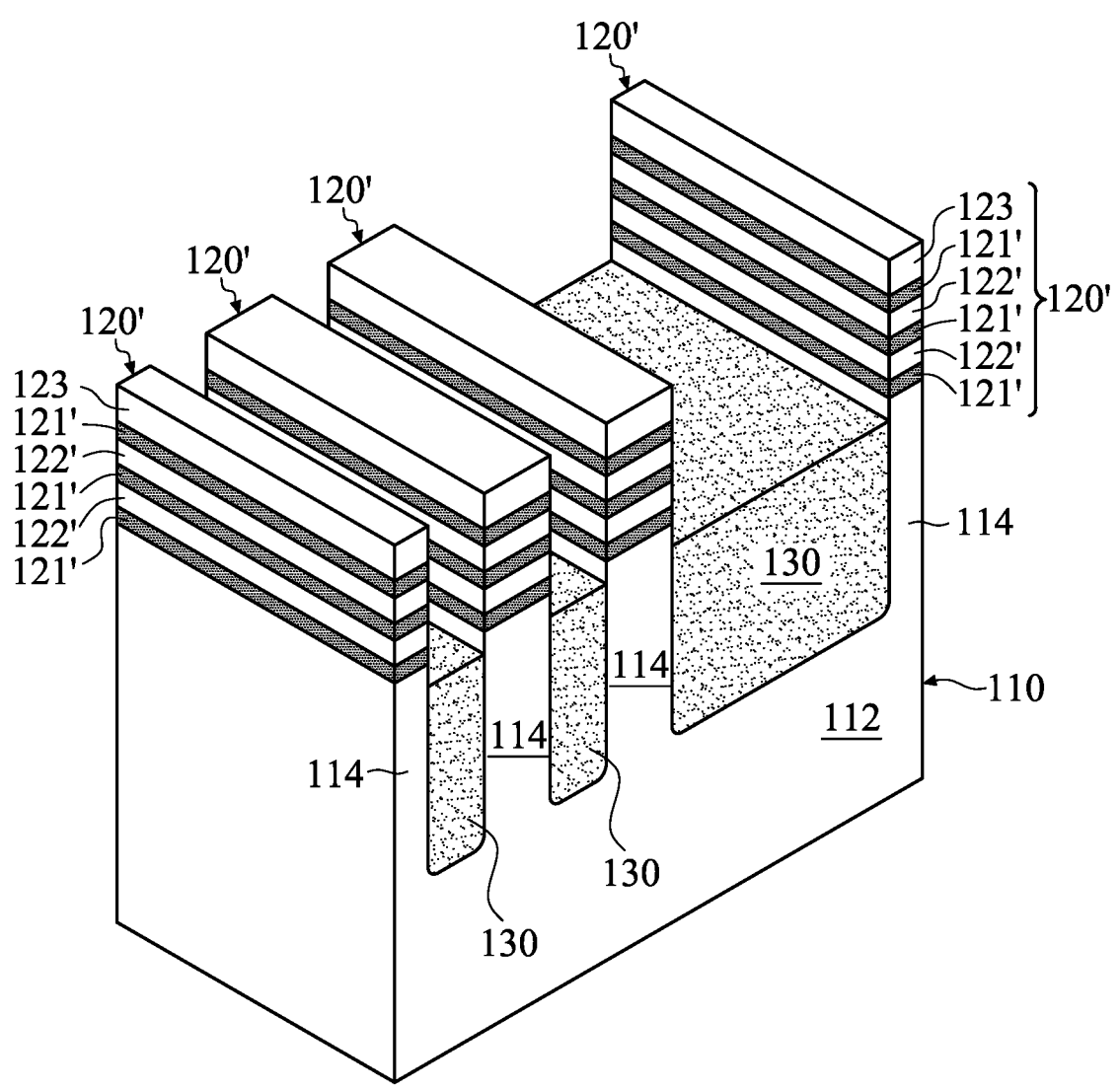
FIGS. 1A-1Z are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" or "about" in the description, such as in "substantially flat" or in "substantially coplanar", etc., will be understood by the person skilled in the art. Where applicable, the term "substantially" may also include embodiments with "entirely", "completely", "all", etc. The term "about" in conjunction with a specific distance or size is to be interpreted so as not to exclude insignificant deviation from the specified distance or size. The term "substantially" or "about" may be varied in different technologies and be in the deviation range understood by the skilled in the art. For example, the term "substantially" or "about" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure. Source/drain structure(s) may refer to a source or a drain, individually or collectively dependent upon the context.

Figure 1B:
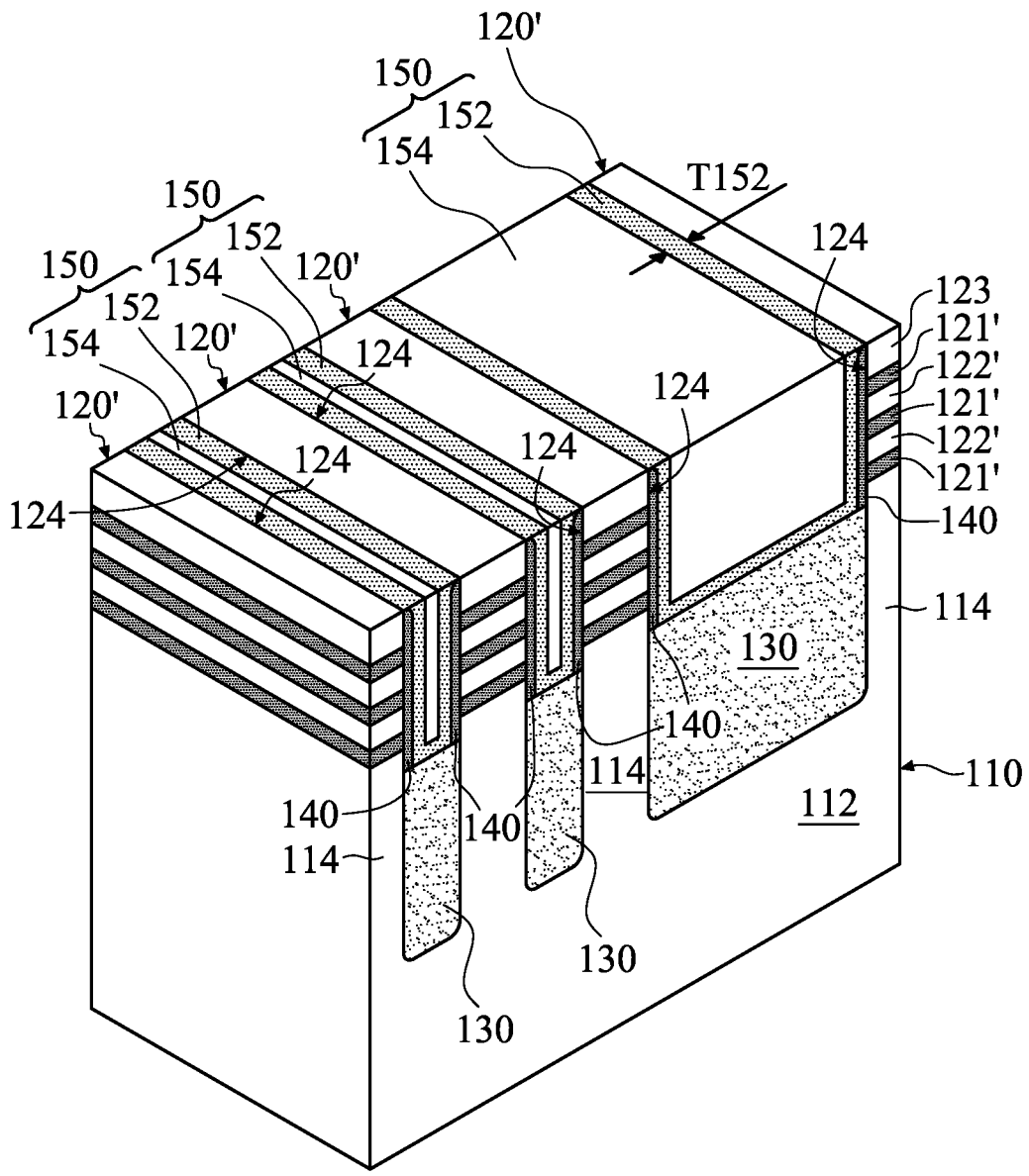
Figure 1C:
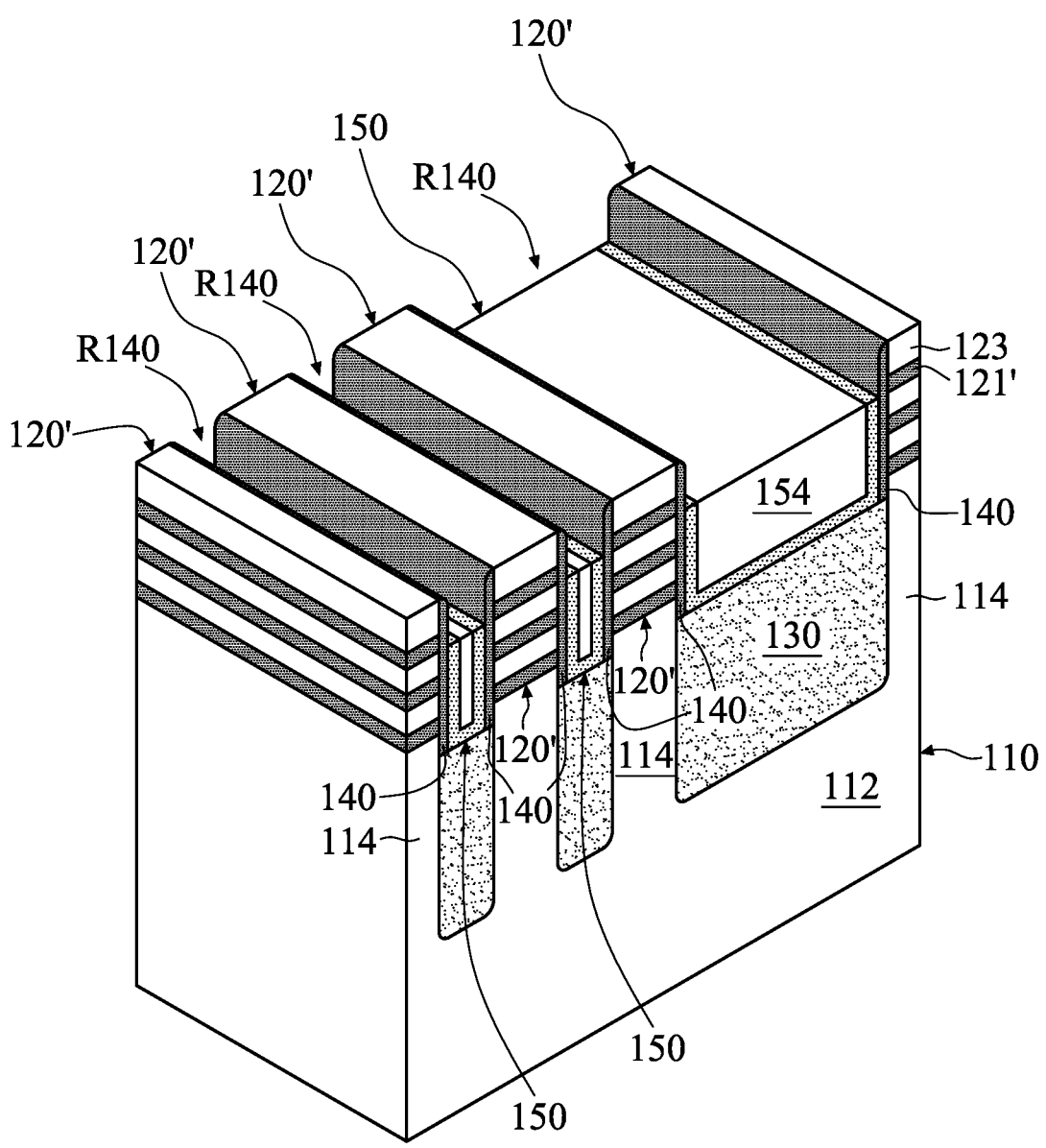
Figure 1D:
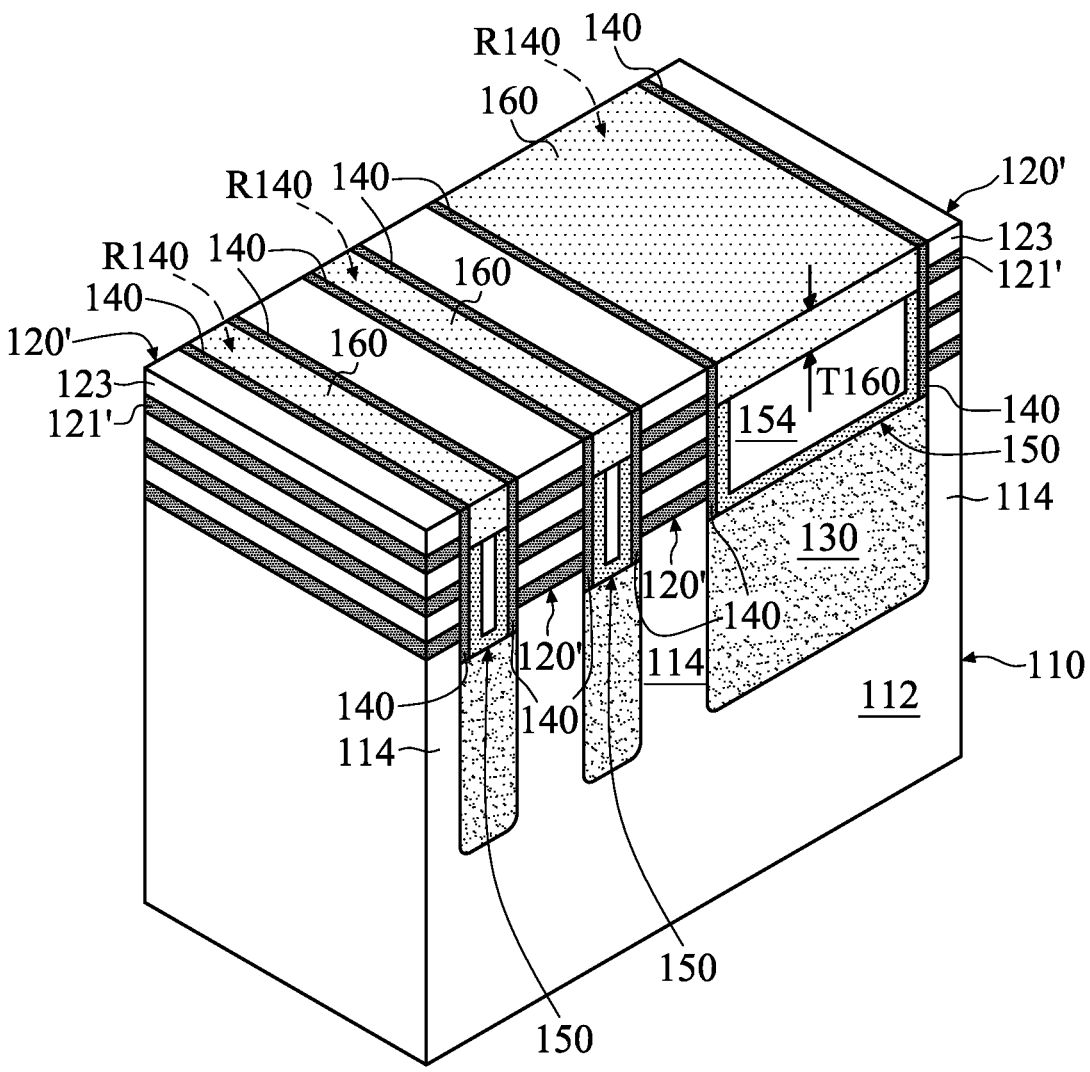
Figure 1E:
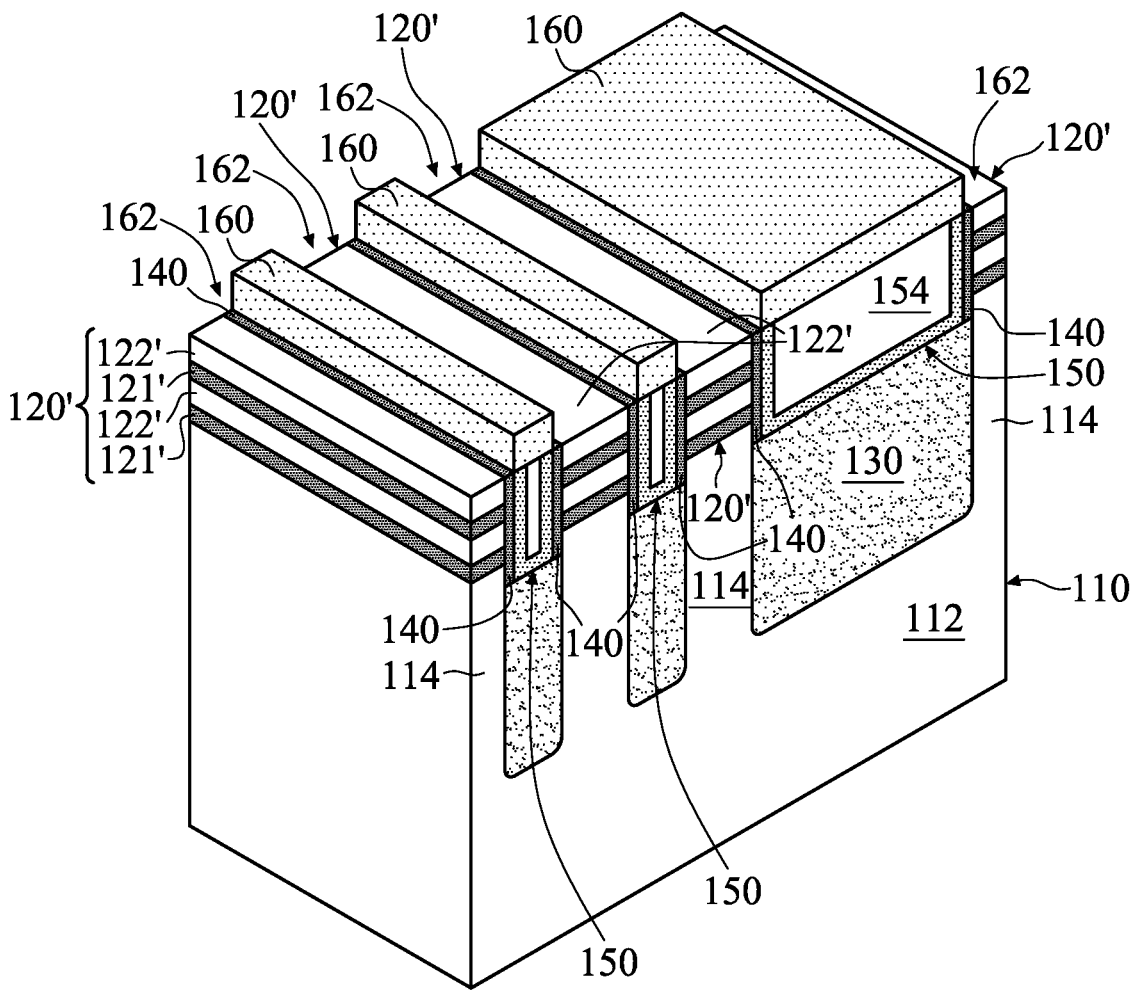
Figure 1F:
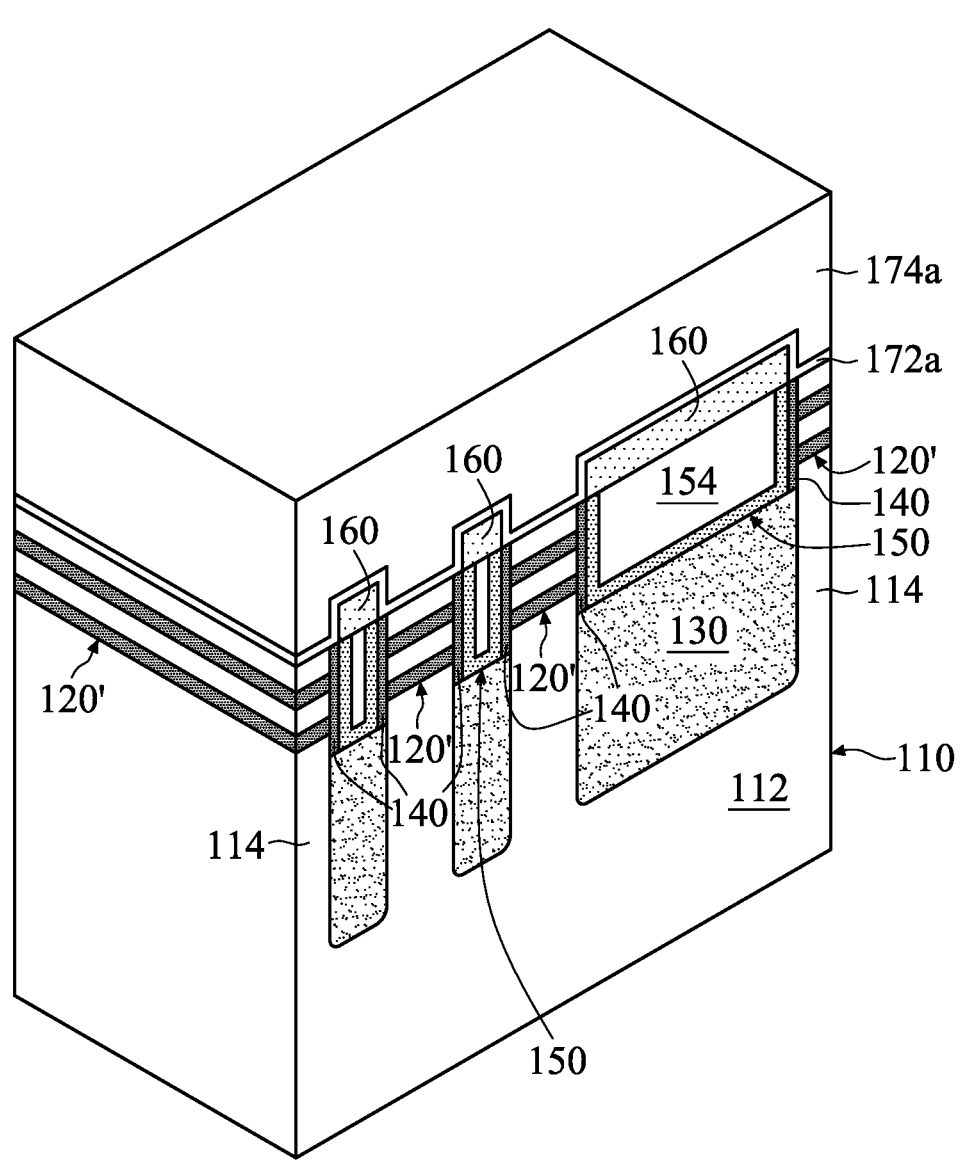
Figure 1G:
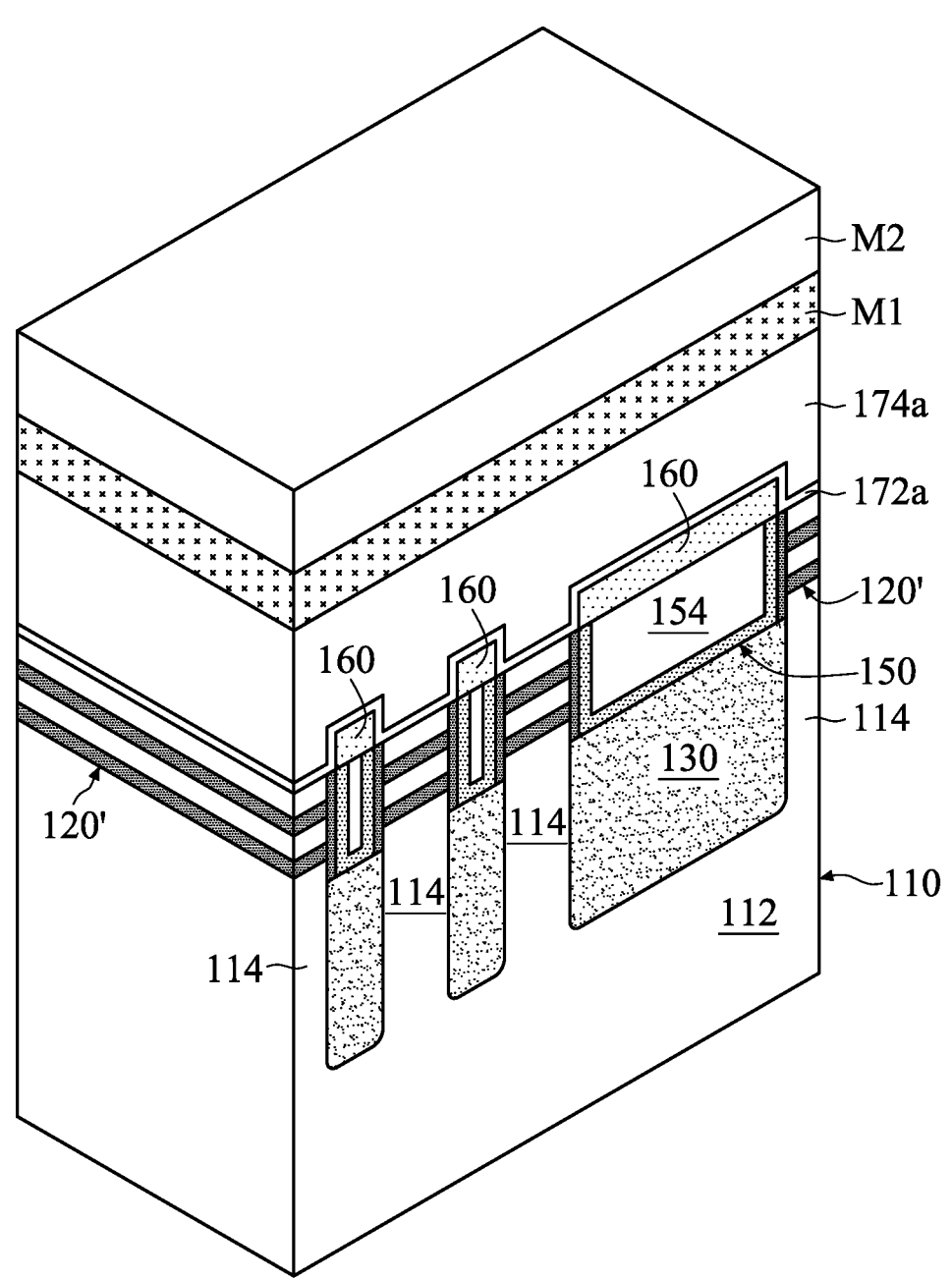
Figure 1H:
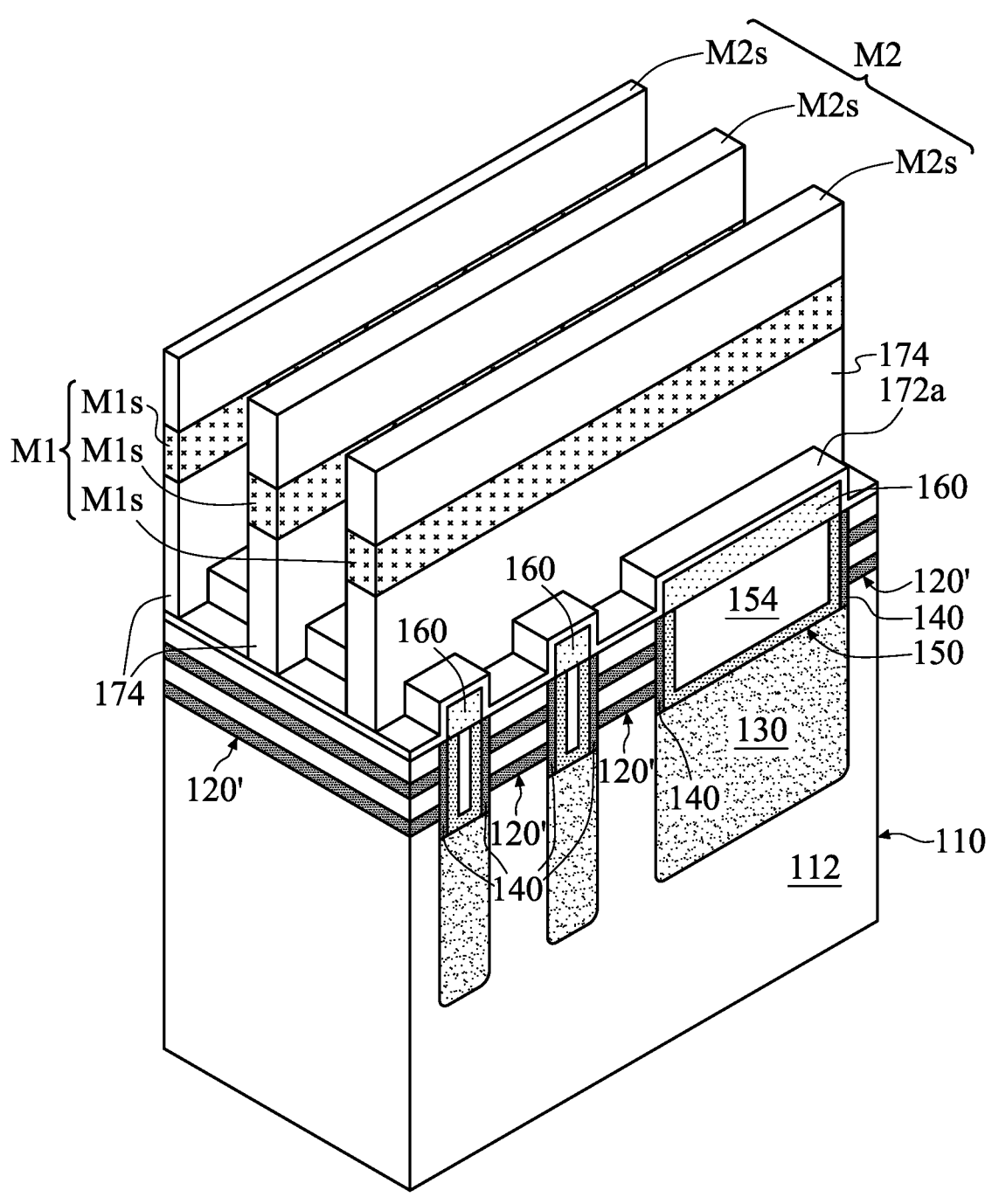
Figure 1I:
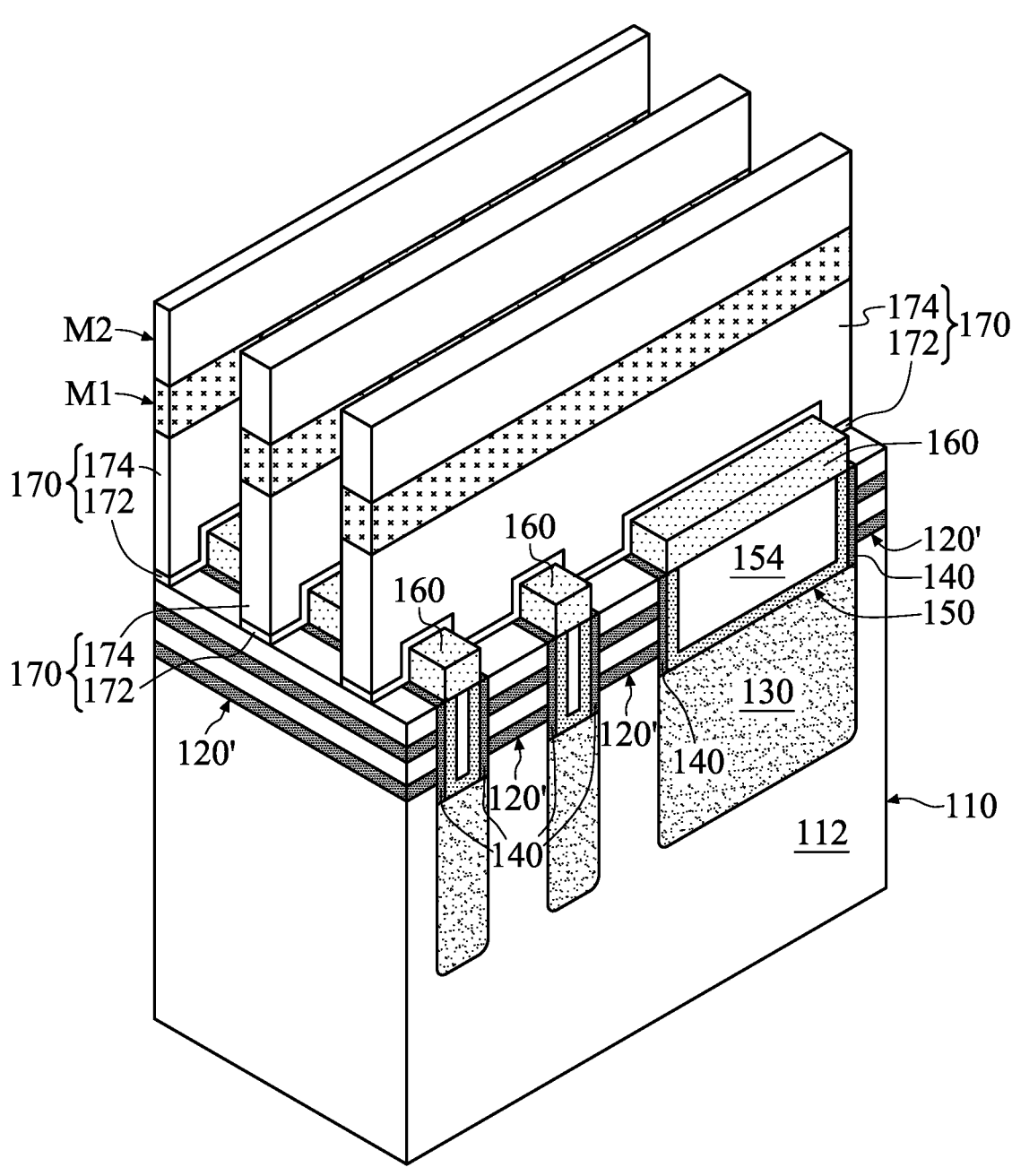
Figure 1J:
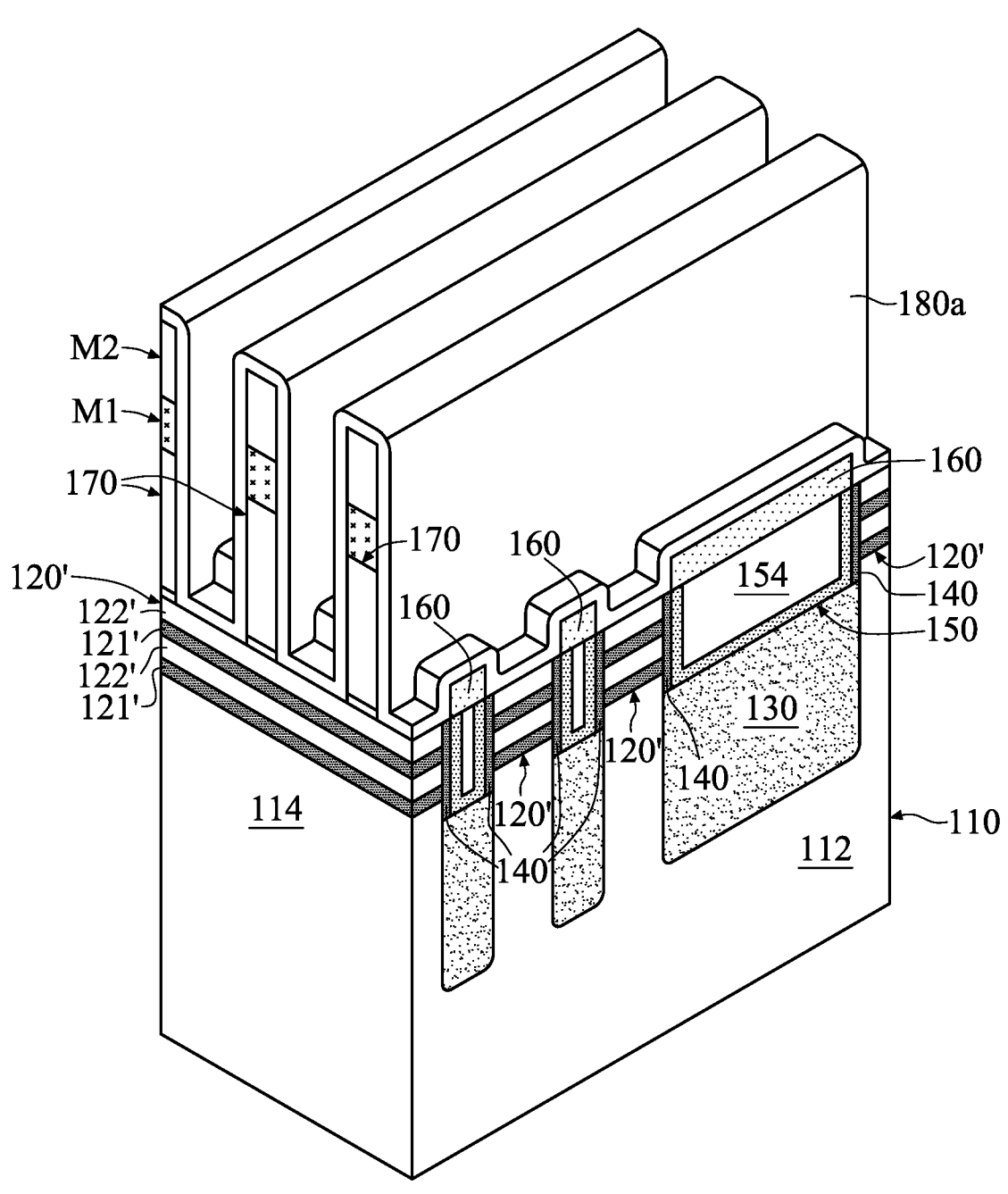
Figure 1K:
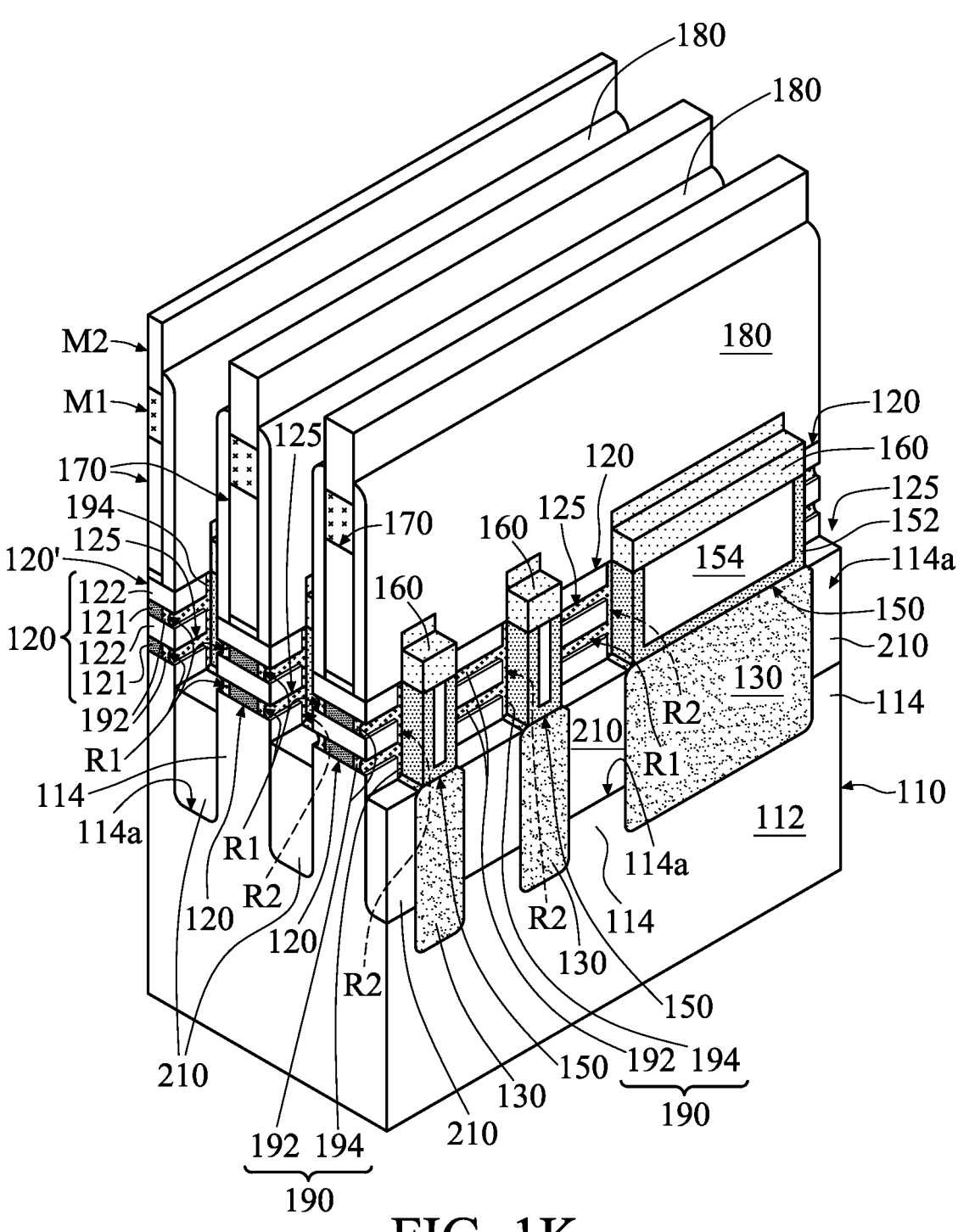
Figure 1L:
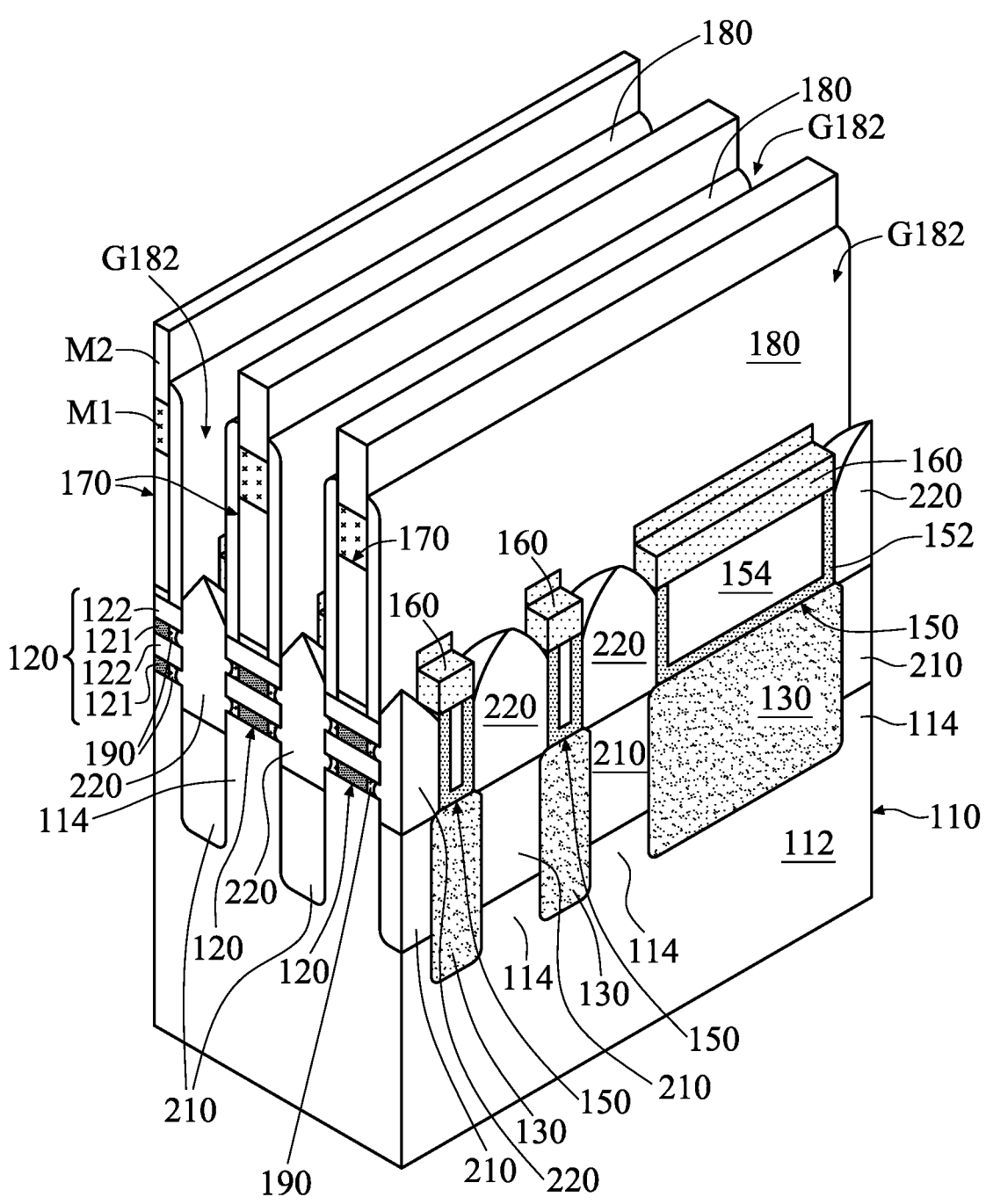
Figure 1M:
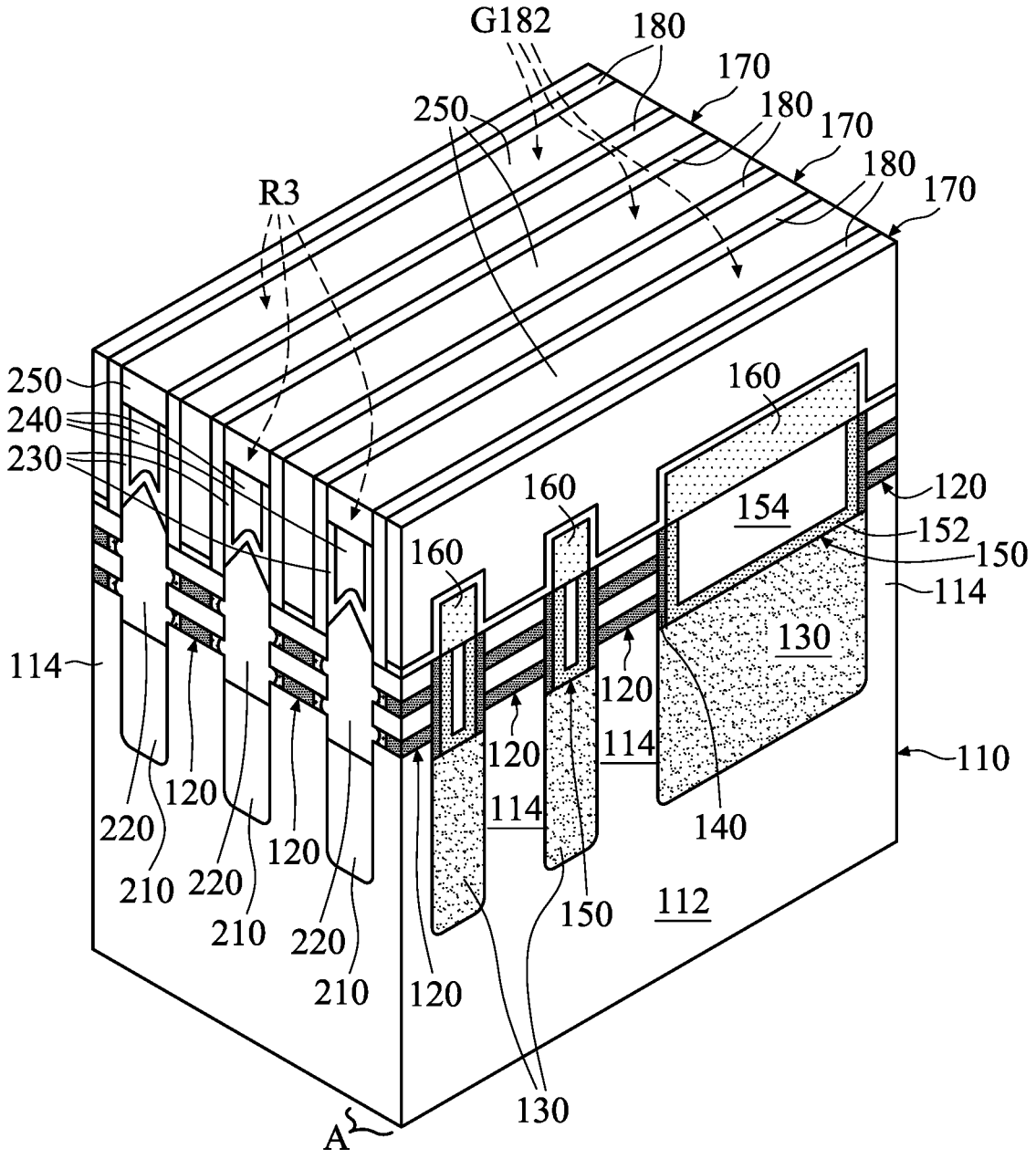
Figure 1N:
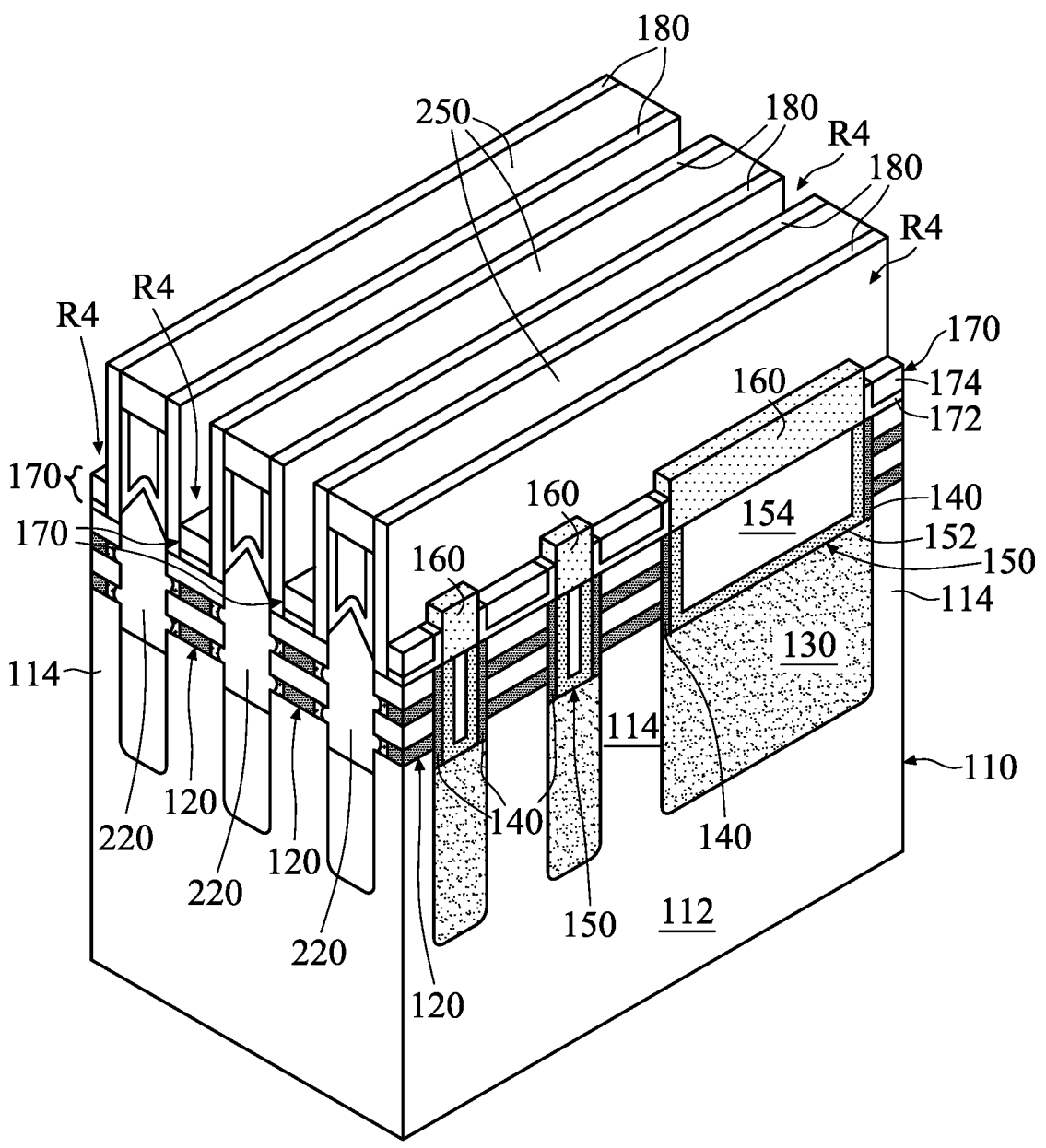
Figure 1O:
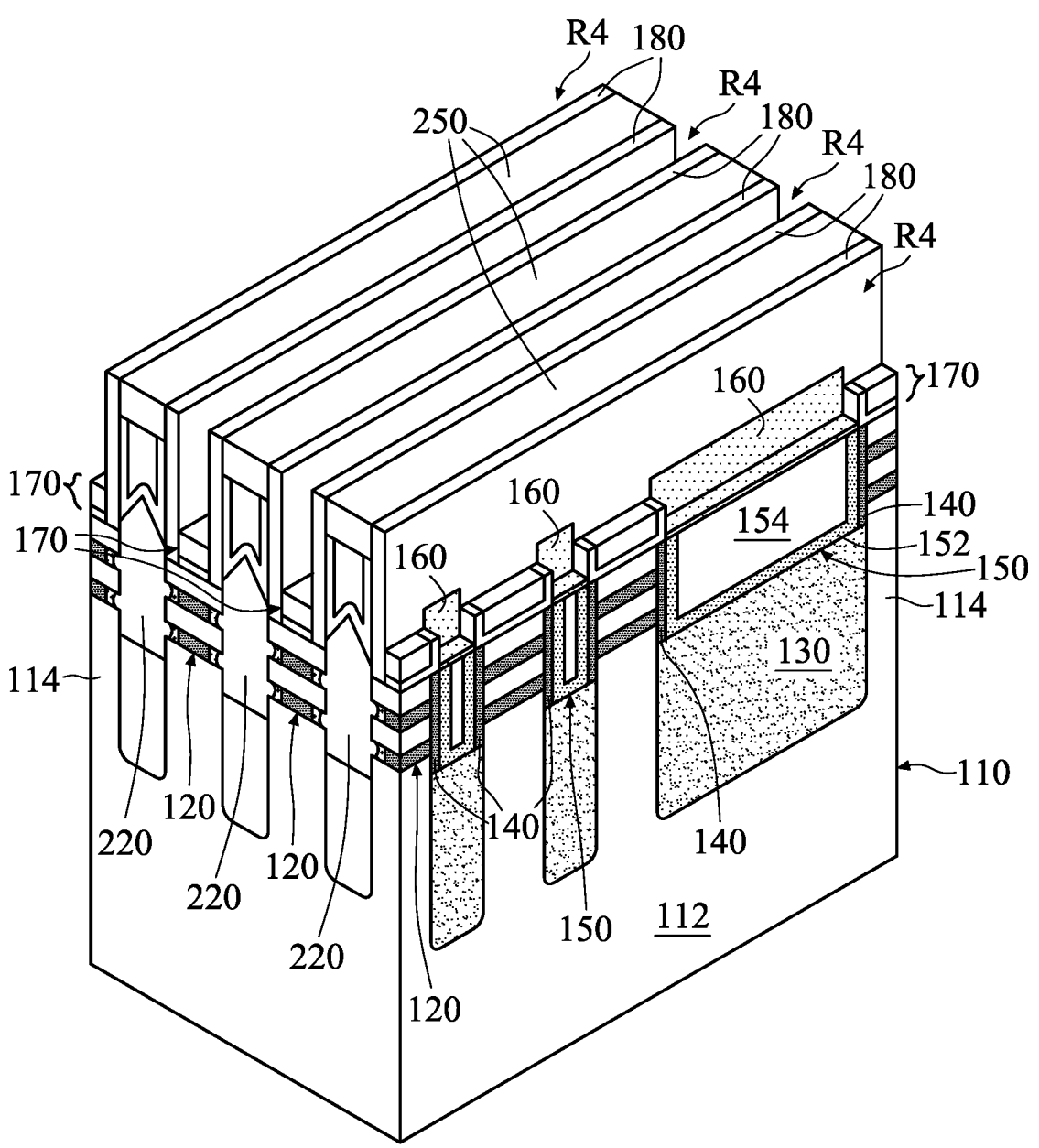
Figure 1P:
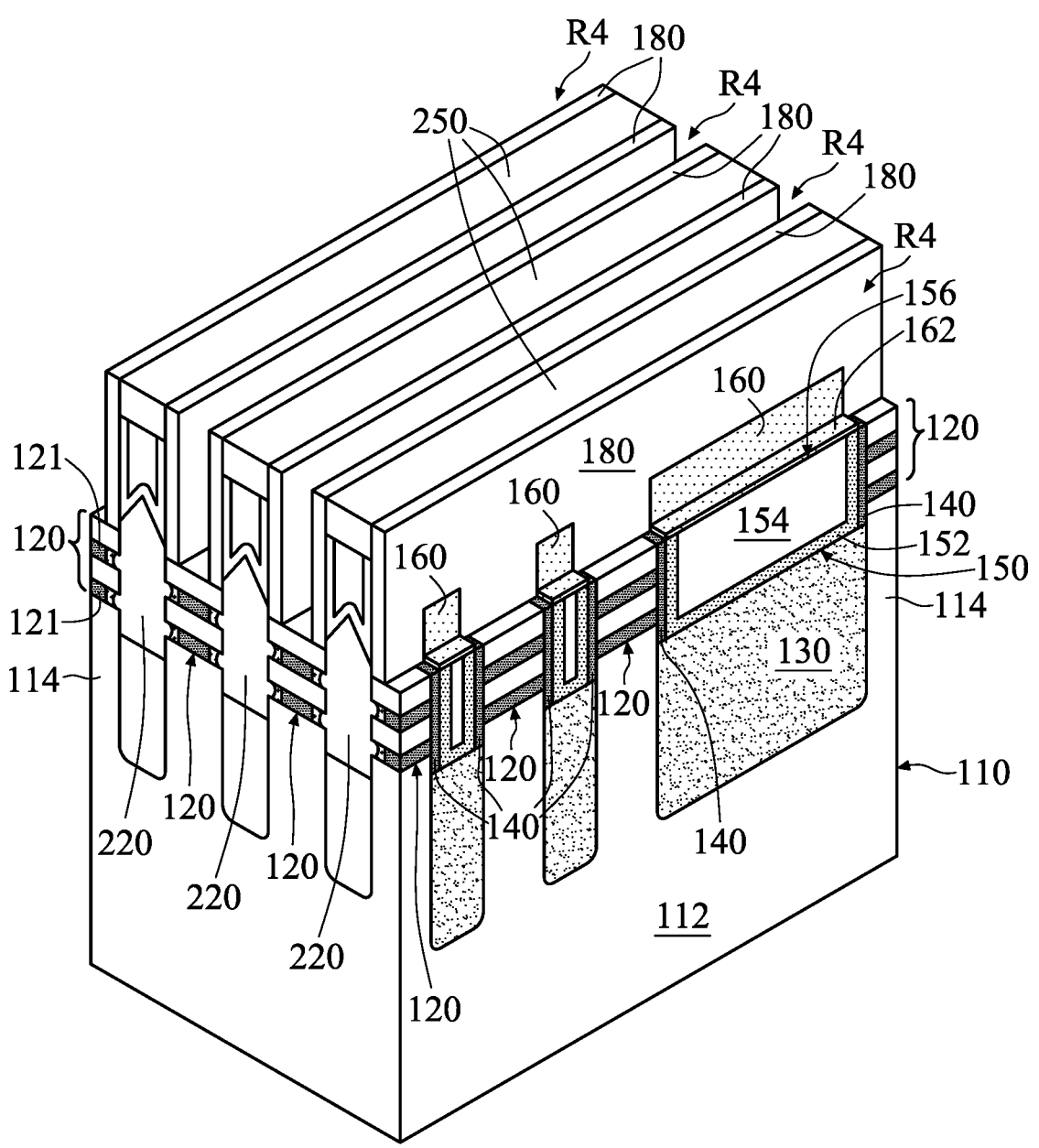
Figure 1Q:
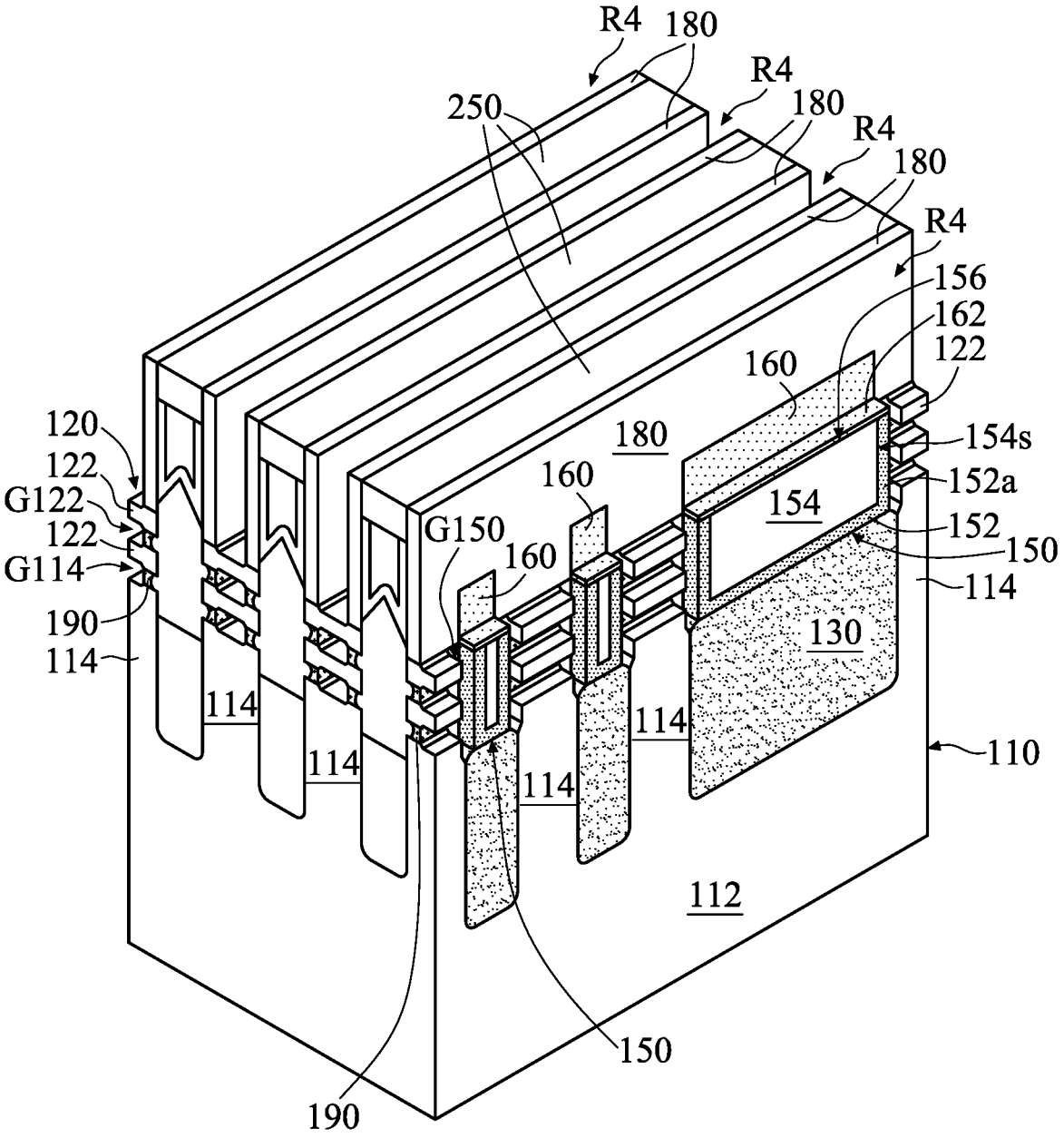
Figure 1R:
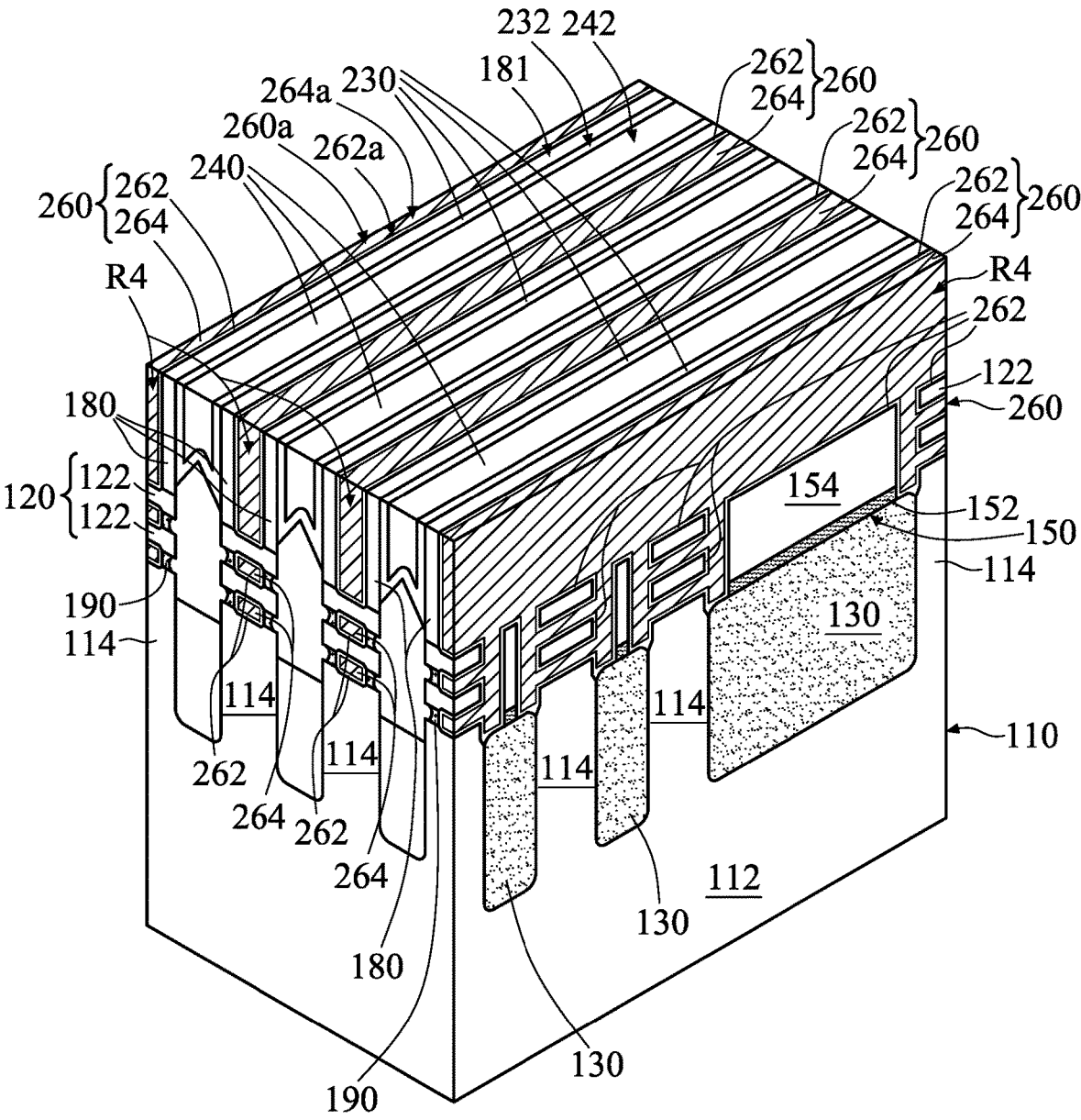
Figure 1S:
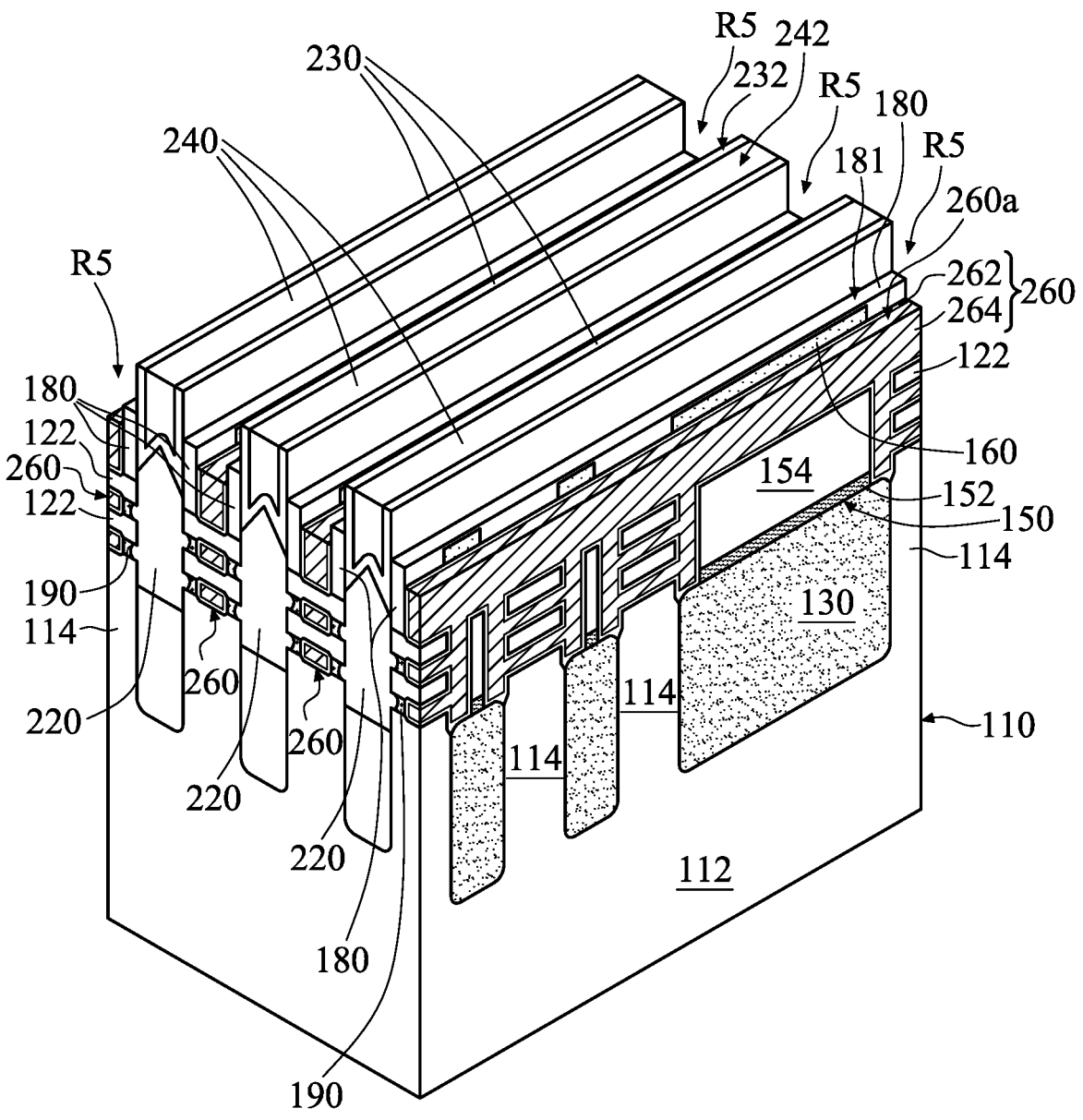
Figure 1T:
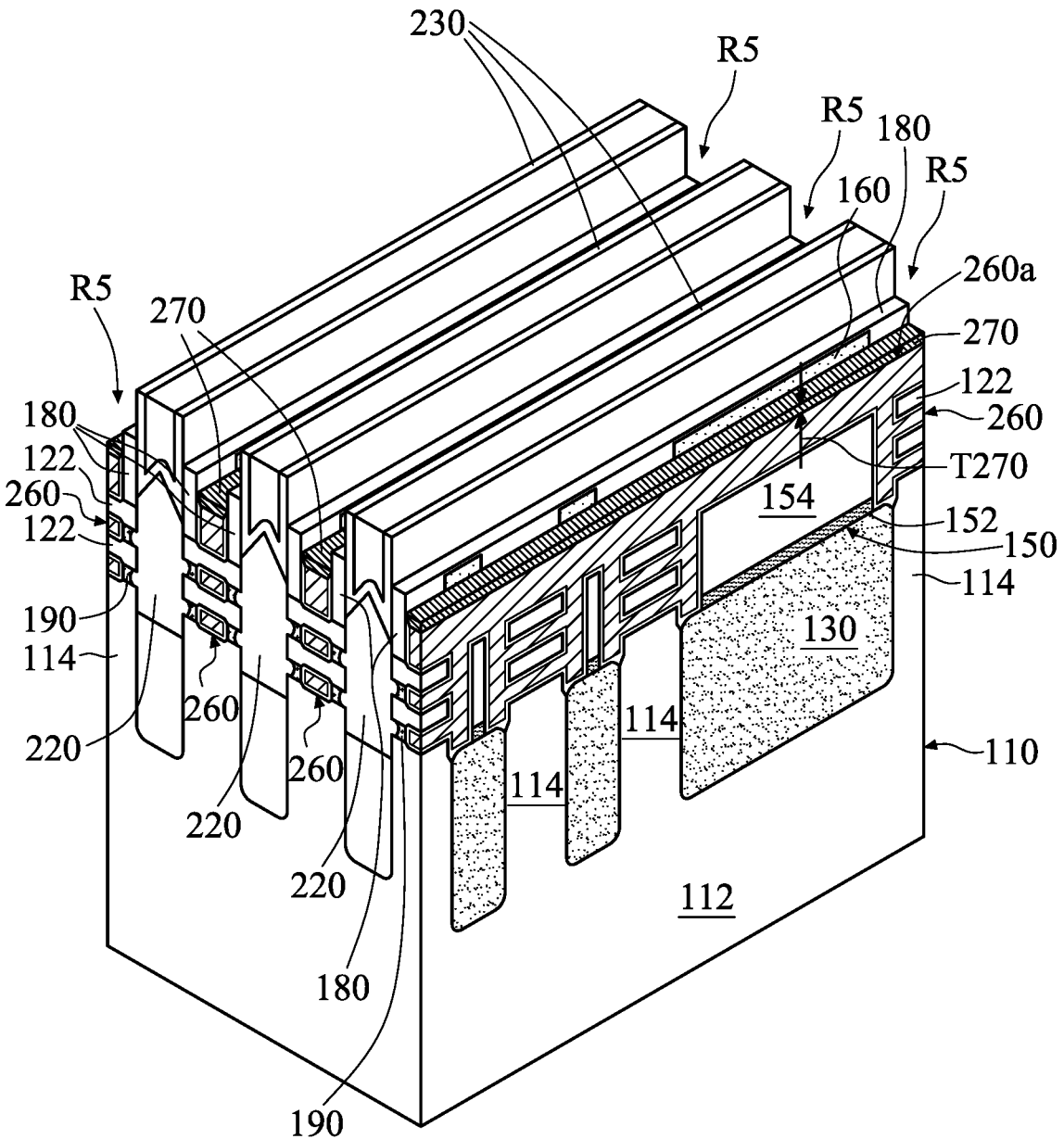
Figure 1U:
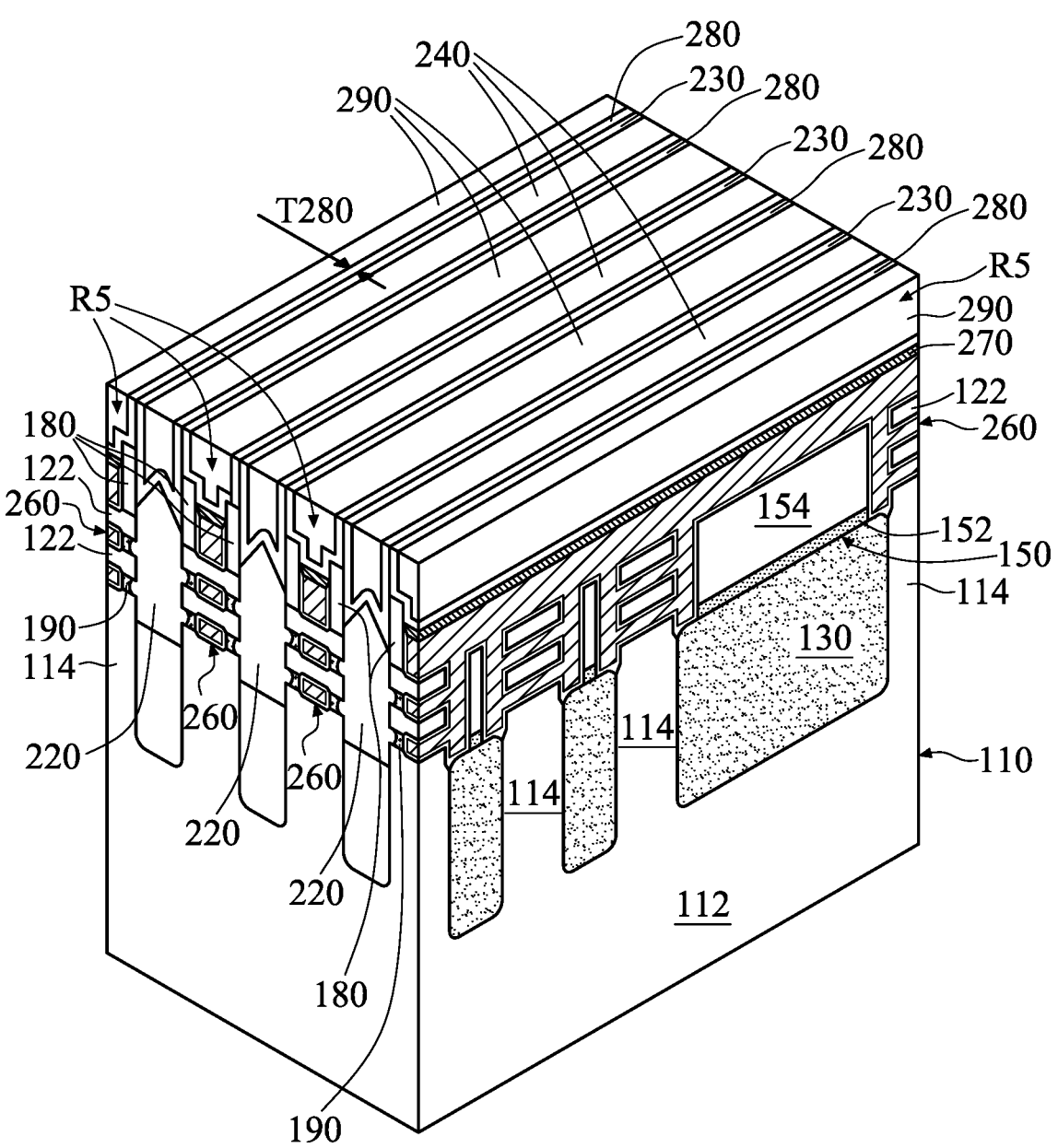
Figure 1V:
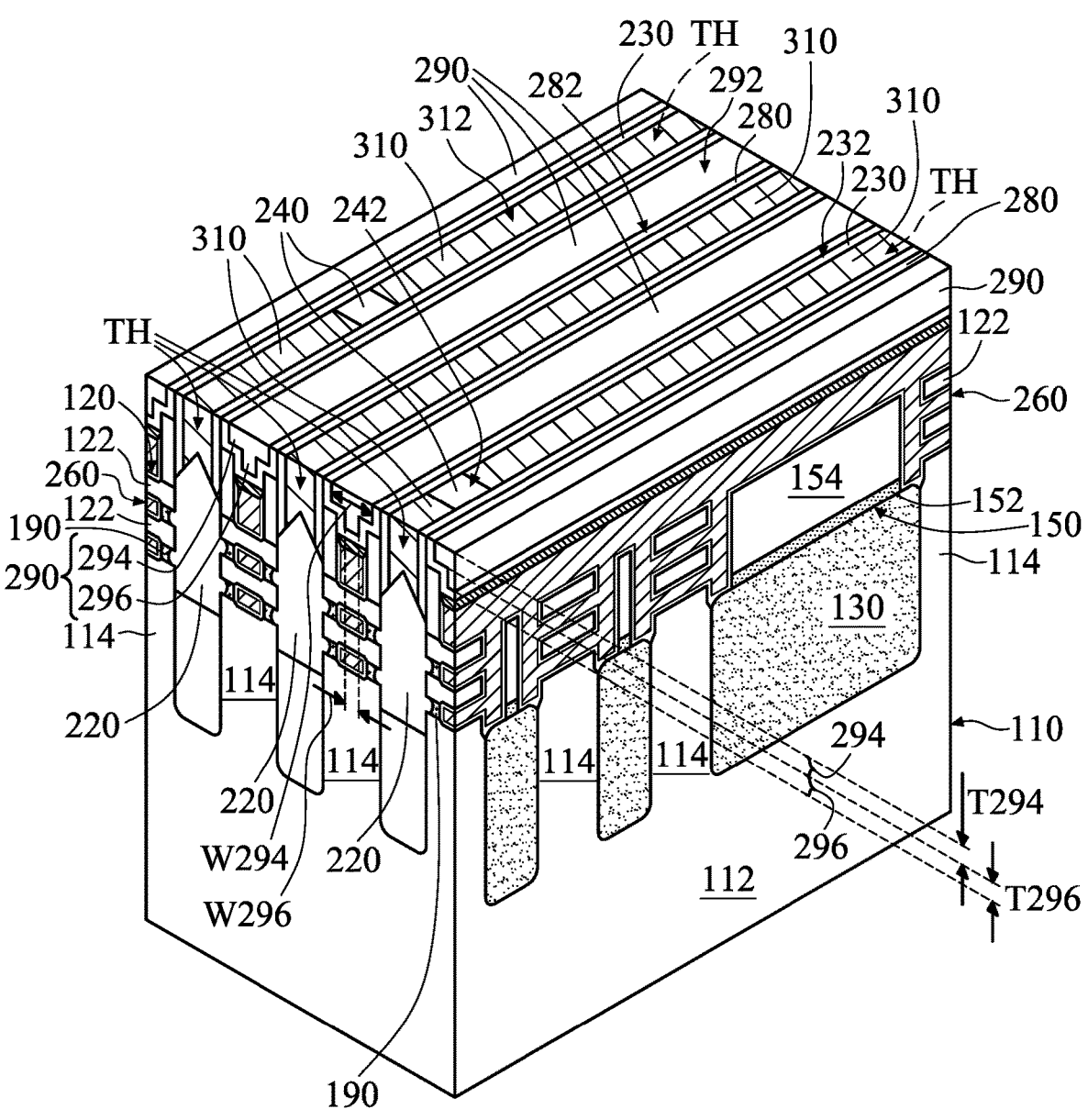
Figure 1W:
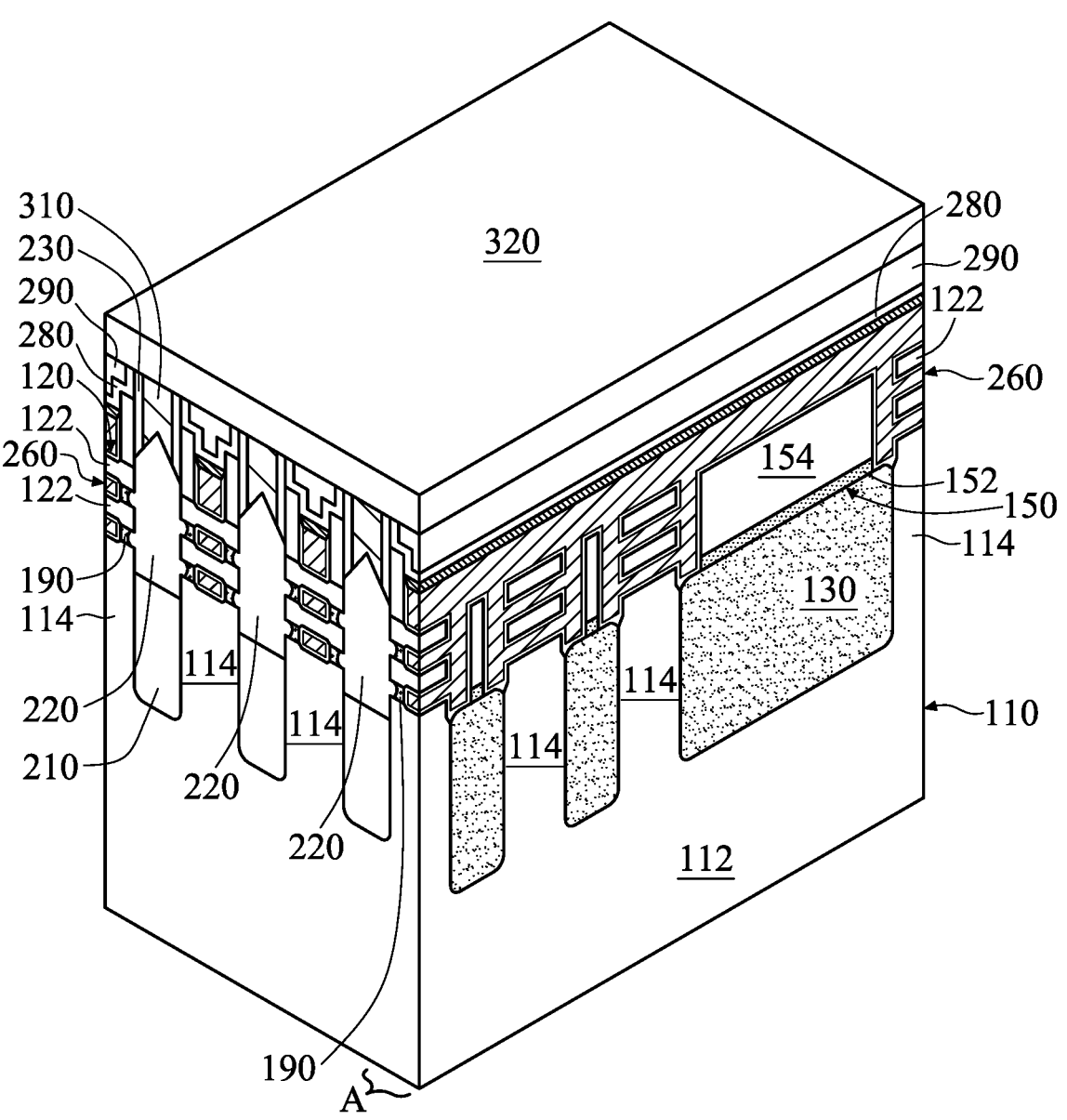
Figure 1X:
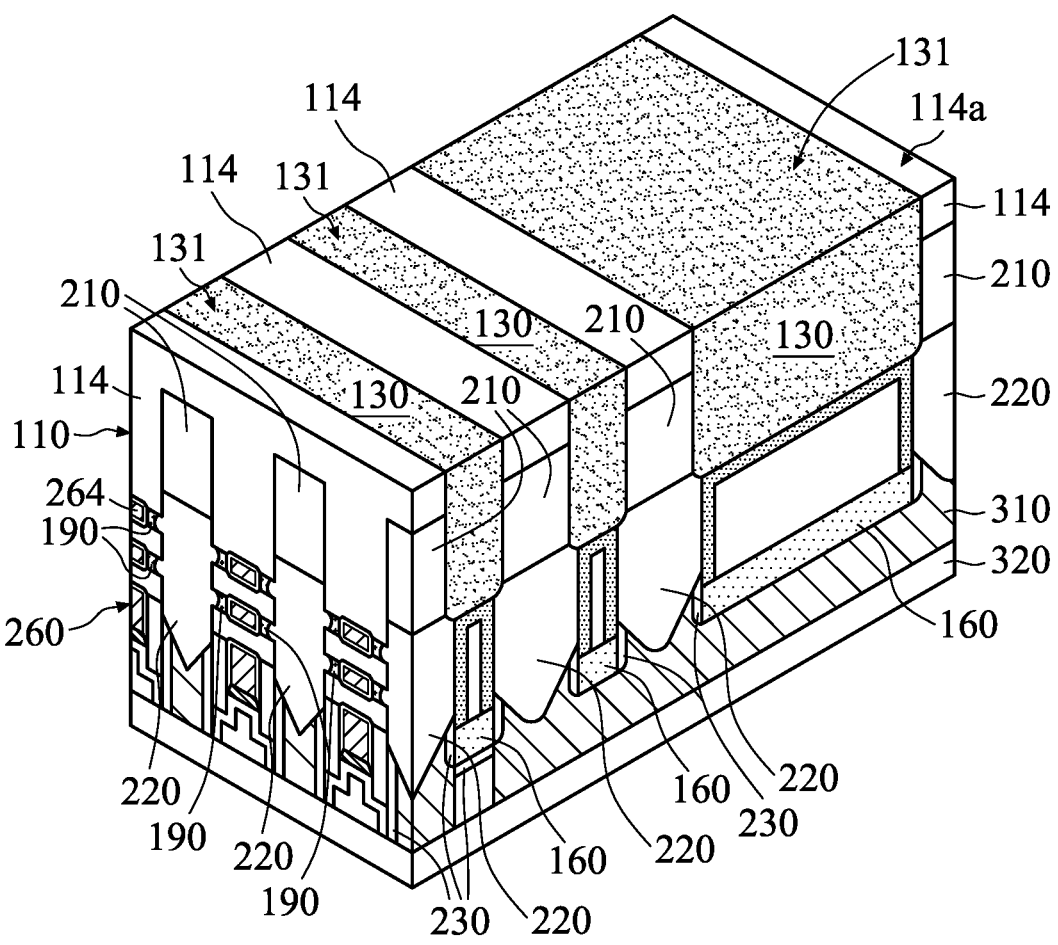
Figure 1Y:
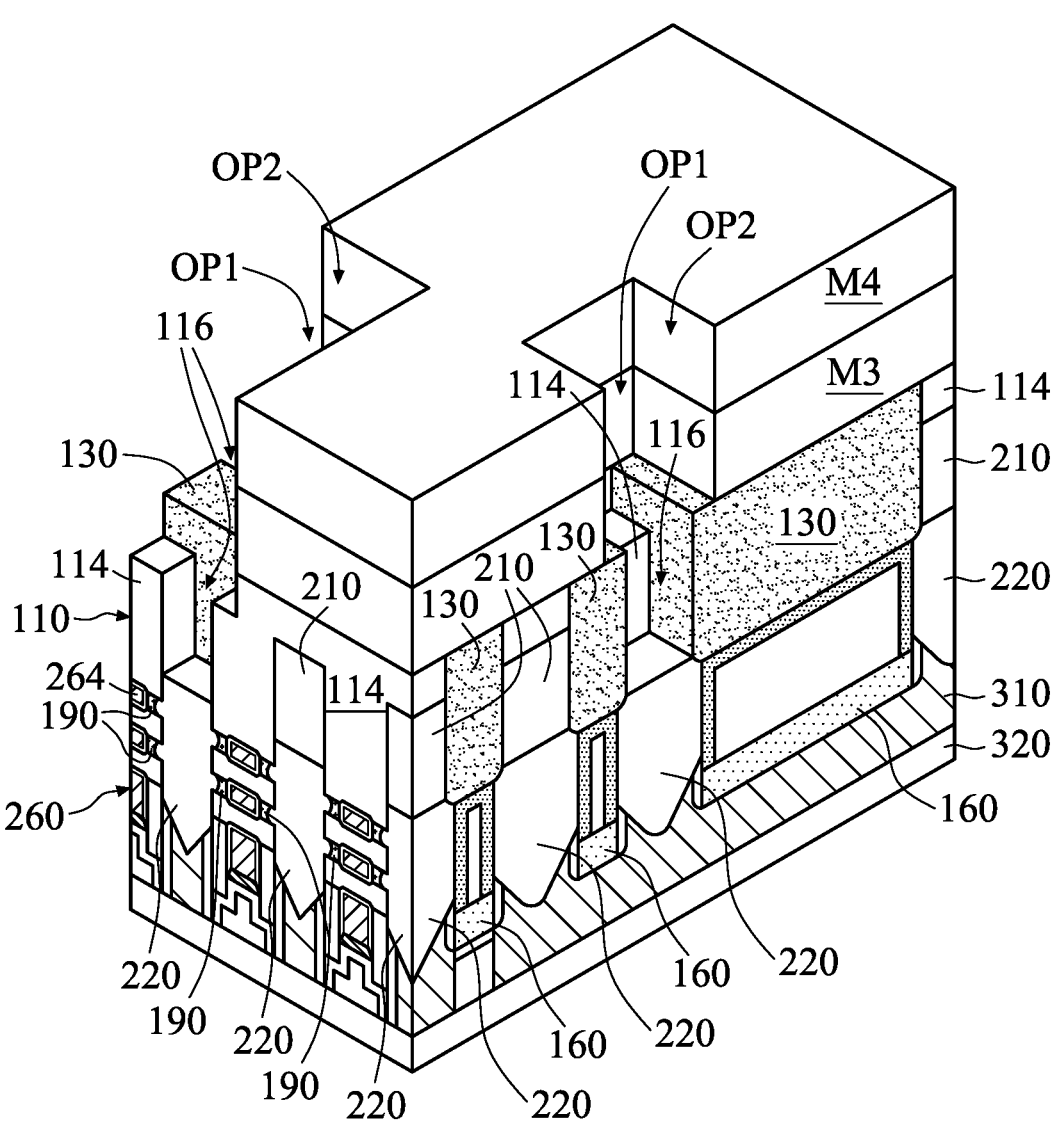
Figure 1Z:
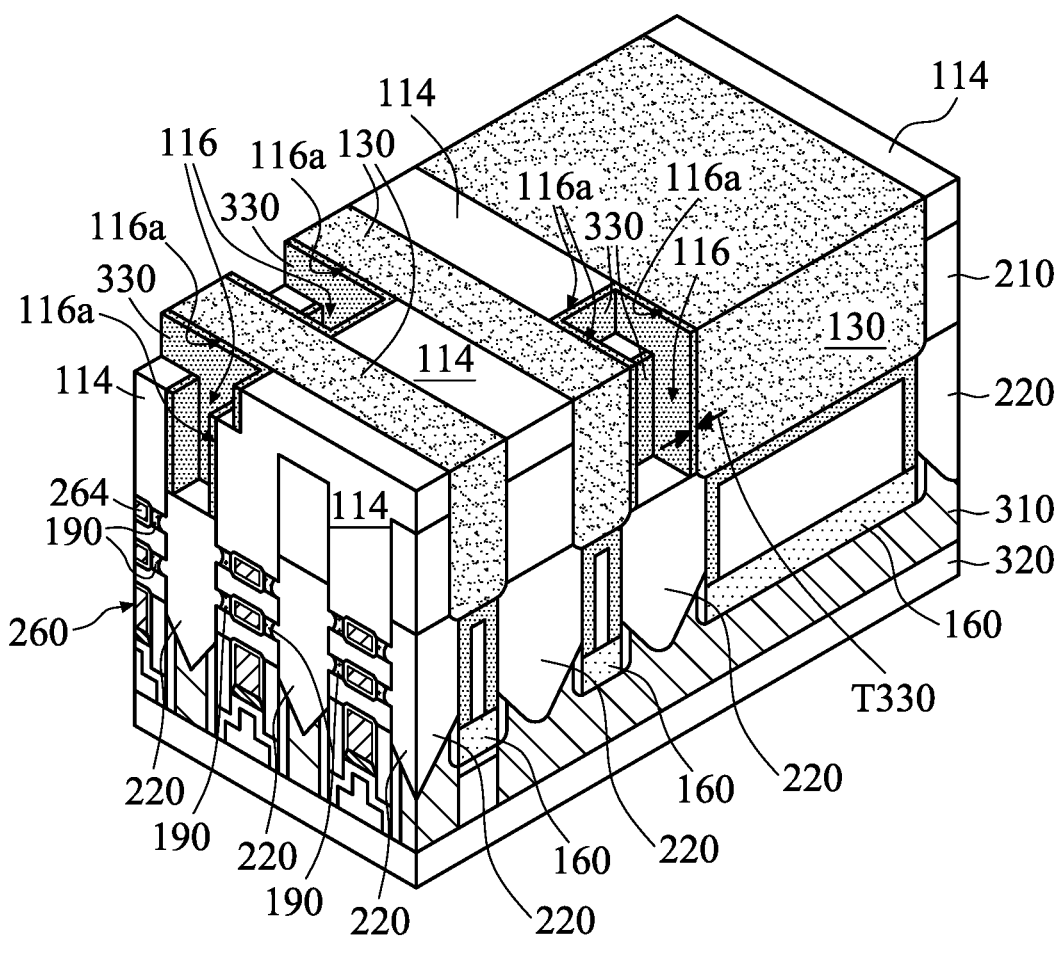

FIGS. 1A-1Z are perspective views of various stages of a process for forming a semiconductor device structure, in accordance with some embodiments. As shown in FIG. 1A, a substrate 110 is provided, in accordance with some embodiments. The substrate 110 includes a base 112 and fins 114, in accordance with some embodiments. The fins 114 are over the base 112, in accordance with some embodiments.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

The multilayer structures 120' are formed over the fins 114 of the substrate 110, in accordance with some embodiments. The multilayer structure 120' is also referred to a super lattice structure or a super lattice epitaxial growth structure, in accordance with some embodiments. Each multilayer structure 120' includes sacrificial layers 121', channel layers 122', and a thick sacrificial layer 123, in accordance with some embodiments. The thick sacrificial layer 123 is over the sacrificial layers 121' and the channel layers 122', in accordance with some embodiments.

The thick sacrificial layer 123 is thicker than the sacrificial layer 121', in accordance with some embodiments. The thick sacrificial layer 123 is thicker than the channel layer 122', in accordance with some embodiments. The thick sacrificial layer 123 and the sacrificial layer 121' are used to reserve a space for a metal gate stack formed in the subsequent process, in accordance with some embodiments.

The sacrificial layers 121' and the channel layers 122' are alternately arranged as illustrated in FIG. 1A, in accordance with some embodiments. It should be noted that, for the sake of simplicity, FIG. 1A shows three layers of the sacrificial layers 121' and two layers of the channel layers 122' for illustration, but does not limit the invention thereto. In some embodiments, the number of the sacrificial layers 121' or the channel layers 122' is between 2 and 6.

The sacrificial layers 121' are made of a first material, such as a first semiconductor material, in accordance with some embodiments. The channel layers 122' and the thick sacrificial layer 123 are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 121' are made of SiGe, and the channel layers 122' and the thick sacrificial layer 123 are made of Si.

In some other embodiments, the sacrificial layers 121' or the channel layers 122' are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 122', the thick sacrificial layer 123, and the substrate 110 are made of the same material such as Si, in accordance with some embodiments. The material of the sacrificial layers 121' is different from the material of the substrate 110, in accordance with some embodiments. In some other embodiments, the sacrificial layers 121', the thick sacrificial layer 123, the channel layers 122', and the substrate 110 are made of different materials, in accordance with some embodiments.

The sacrificial layers 121', the thick sacrificial layer 123, and the channel layers 122' are formed using an epitaxial growth process such as a molecular beam epitaxy (MBE) process, a metal-organic chemical vapor deposition (MOCVD) process, and/or another suitable epitaxial growth process.

As shown in FIG. 1A, an isolation structure 130 is formed over the base 112, in accordance with some embodiments. The isolation structure 130 surrounds lower portions of the fins 114, in accordance with some embodiments. The isolation structure 130 is made of oxides (e.g., silicon oxide), nitrides (e.g., silicon nitride), fluorosilicate glass (FSG), a low-k dielectric material, or another suitable dielectric material, in accordance with some embodiments. The isolation structure 130 may be formed by a chemical vapor deposition process, an atomic layer deposition process, a physical vapor deposition (PVD) process, or another applicable process.

As shown in FIG. 1B, a cladding layer 140 is formed over the sidewalls 124 of the multilayer structures 120', in accordance with some embodiments. The cladding layer 140 is used to reserve a space for a metal gate stack formed in the subsequent process, in accordance with some embodiments.

The sacrificial layers 121' and the cladding layer 140 are made of the same first material, in accordance with some embodiments. The channel layers 122' are made of a second material, in accordance with some embodiments. The first material is different from the second material, in accordance with some embodiments.

The cladding layer 140 is made of a semiconductor material such as SiGe, Si, and/or germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof, in accordance with some embodiments.

The cladding layer 140 is formed using an epitaxial growth process such as a molecular beam epitaxy (MBE) process, a metal-organic chemical vapor deposition (MOCVD) process, and/or another suitable epitaxial growth process.

As shown in FIG. 1B, a liner layer 152 is conformally formed over the isolation structure 130 and the cladding layer 140, in accordance with some embodiments. The thickness T152 of the liner layer 152 ranges from about 1.5 nm to about 10 nm, in accordance with some embodiments. As shown in FIG. 1B, a dielectric layer 154 is formed over the liner layer 152, in accordance with some embodiments. The liner layer 152 and the dielectric layer 154 together form isolation fins 150, in accordance with some embodiments.

The liner layer 152 is made of nitrides (e.g., silicon nitride, silicon carbon nitride, or SiOCN) or another suitable dielectric material, in accordance with some embodiments. The dielectric layer 154 is made of oxide (such as silicon oxide), fluorosilicate glass (FSG), a low-k dielectric material, and/or another suitable dielectric material. In some embodiments, the liner layer 152 and the dielectric layer 154 are made of different materials.

The liner layer 152 may be deposited using an atomic layer deposition (ALD) process, a chemical vapor deposition (CVD) process, or another applicable process. The dielectric layer 154 may be deposited using a chemical vapor deposition process, an atomic layer deposition process, a physical vapor deposition (PVD) process, or another applicable process.

As shown in FIG. 1C, upper portions of the isolation fins 150 are removed, in accordance with some embodiments. The removal process forms recesses R140 in the cladding layer 140, in accordance with some embodiments. The removal process includes an etching process such as a dry etching process or a wet etching process, in accordance with some embodiments.

As shown in FIG. 1D, dielectric fins 160 are formed over the isolation fins 150 and in the recesses R140, in accordance with some embodiments. The thickness T160 of the dielectric fin 160 ranges from about 3 nm to about 20 nm, in accordance with some embodiments. The formation of the dielectric fins 160 includes forming a dielectric layer over the isolation fins 150, the cladding layer 140, and the multilayer structures 120' and in the recesses R140; and removing portions of the dielectric layer outside of the recesses R140, in accordance with some embodiments. The dielectric layer remaining in the recesses R140 forms the dielectric fins 160, in accordance with some embodiments.

The dielectric layer is formed using a deposition process such as a chemical vapor deposition process, a physical vapor deposition process, an atomic layer deposition process, or the like, in accordance with some embodiments. The removal process of the portions of the dielectric layer outside of the recesses R140 includes a planarization process such as a chemical mechanical polishing process, in accordance with some embodiments.

The dielectric fins 160 are made of a dielectric material, such as a high dielectric constant (high-k) material, in accordance with some embodiments. The term "high-k material" means a material having a dielectric constant greater than the dielectric constant of silicon dioxide, in accordance with some embodiments.

The high-k material includes metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), aluminum oxide, AlON, $ZrO_2$, $TiO_2$, ZrAlO, ZnO, $La_2O_3$, hafnium dioxide-alumina ($HfO_2$—$Al_2O_3$) alloy, other suitable high-k dielectric materials, or combinations thereof, in accordance with some embodiments. In some other embodiments, the high-k material includes metal nitrides, metal silicates, transition metal-oxides, transition metal-nitrides, transition metal-silicates, oxynitrides of metals, other suitable materials, or combinations thereof.

As shown in FIG. 1E, the thick sacrificial layer 123, the topmost one of the sacrificial layers 121', and upper portions of the cladding layer 140 are removed, in accordance with some embodiments. After the removal process, trenches 162 are formed between the dielectric fins 160, in accordance with some embodiments.

The trenches 162 expose the multilayer structures 120' and the cladding layer 140 thereunder, in accordance with some embodiments. The removal process includes an etching process such as a wet etching process or a dry etching process, in accordance with some embodiments.

As shown in FIG. 1F, a gate dielectric material layer 172a is conformally deposited over the dielectric fins 160, the multilayer structures 120', and the cladding layer 140, in accordance with some embodiments. The gate dielectric material layer 172a is made of an insulating material, such as oxide (e.g., silicon oxide), in accordance with some embodiments.

The gate dielectric material layer 172a is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a physical vapor deposition (PVD) process, or another applicable process.

As shown in FIG. 1F, a gate electrode layer 174a is formed over the gate dielectric material layer 172a, in accordance with some embodiments. The gate electrode layer 174a is made of a semiconductor material (e.g. polysilicon) or a conductive material (e.g., metal or alloy), in accordance with some embodiments. The gate electrode layer 174a is formed by a deposition process, such as a physical vapor deposition (PVD) process, a chemical vapor deposition (CVD) process, or another applicable process, in accordance with some embodiments.

As shown in FIG. 1G, a mask layer M1 is formed over the gate electrode layer 174a, in accordance with some embodiments. In some embodiments, the mask layer M1 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide).

In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

As shown in FIG. 1G, a mask layer M2 is formed over the mask layer M1, in accordance with some embodiments. In some embodiments, the mask layer M1 serves a buffer layer or an adhesion layer that is formed between the underlying gate electrode layer 174*a* and the overlying mask layer M2. The mask layer M1 may also be used as an etch stop layer when the mask layer M2 is removed or etched.

The mask layers M1 and M2 are made of different materials, in accordance with some embodiments. In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide).

In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a physical vapor deposition process, a spin-on process, or another applicable process.

As shown in FIGS. 1G and 1H, the mask layers M1 and M2 are patterned to expose portions of the gate electrode layer 174*a*, in accordance with some embodiments. The patterned mask layer M1 has strip portions M1*s*, in accordance with some embodiments. The patterned mask layer M2 has strip portions M2*s*, in accordance with some embodiments.

As shown in FIG. 1H, the portions of the gate electrode layer 174*a* are removed using the patterned mask layers M1 and M2, in accordance with some embodiments. The removal process includes an anisotropic etching process (e.g., a dry etching process), in accordance with some embodiments. After the removal process, the remaining gate electrode layer 174*a* forms gate electrodes 174, in accordance with some embodiments.

As shown in FIG. 1I, the portions of the gate dielectric material layer 172*a* are removed using the patterned mask layers M1 and M2, in accordance with some embodiments. The removal process includes an etching process, such as a dry etching process, in accordance with some embodiments.

After the removal process, the remaining gate dielectric material layer 172*a* forms a gate dielectric layer 172, in accordance with some embodiments. The gate dielectric layer 172 and one of the gate electrodes 174 together form a gate stack 170, in accordance with some embodiments. The removal process includes an anisotropic etching process (e.g., a dry etching process), in accordance with some embodiments.

As shown in FIG. 1J, a spacer layer 180*a* is formed over the gate stacks 170, the mask layers M1 and M2, the dielectric fins 160, the cladding layer 140, and the multilayer structures 120', in accordance with some embodiments. The spacer layer 180*a* is made of an oxide-containing insulating material, such as silicon oxide. In some other embodiments, the spacer layer 180*a* is made of a nitride-containing insulating material, such as silicon nitride (SiN), silicon oxynitride (SiON), silicon oxycarbonitride (SiOCN), or silicon carbonitride (SiCN).

The spacer layer is formed using a deposition process, such as a chemical vapor deposition (CVD) process, an atomic layer deposition (ALD) process, or a physical vapor deposition (PVD) process, in accordance with some embodiments.

As shown in FIG. 1K, portions of the spacer layer 180*a* are removed, in accordance with some embodiments. After the removal process, the spacer layer 180*a* remains over the sidewalls of the gate stacks 170 and the mask layers M1 and M2, in accordance with some embodiments. The remaining spacer layer 180*a* forms a spacer 180, in accordance with some embodiments. In some embodiments, the spacer 180 is a single-layered structure. In some embodiments, the spacer 180 is a multi-layered structure. The removal process includes an etching process, such as an anisotropic etching process (e.g., a dry etching process), in accordance with some embodiments.

As shown in FIG. 1K, the multilayer structures 120', the fins 114, the dielectric fins 160, and the cladding layer 140, which are not covered by the gate stacks 170 and the spacer 180, are partially removed, in accordance with some embodiments. The removal process forms recesses 125 in the multilayer structures 120', which are not covered by the gate stacks 170 and the spacer 180, in accordance with some embodiments. Each multilayer structure 120' is divided into multilayer stacks 120 by the recesses 125, in accordance with some embodiments. The removal process forms recesses 114*a* in the fins 114, in accordance with some embodiments.

In each multilayer stack 120, the remaining sacrificial layers 121' form sacrificial nanostructures 121, and the remaining channel layers 122' form channel nanostructures 122, in accordance with some embodiments. Each multilayer stack 120 includes two sacrificial nanostructures 121 and two channel nanostructures 122, in accordance with some embodiments.

The sacrificial nanostructures 121 and the channel nanostructures 122 include nanowires and/or nanosheets, in accordance with some embodiments. The removal process for forming the recesses 125 and 114*a* includes an etching process, such as an anisotropic etching process (e.g., a dry etching process), in accordance with some embodiments.

As shown in FIGS. 1J and 1K, portions of the sacrificial nanostructures 121 and the cladding layer 140 are removed from sidewalls of the sacrificial nanostructures 121 and the cladding layer 140, in accordance with some embodiments. Therefore, the removal process forms recesses R1 in the multilayer stacks 120, in accordance with some embodiments. Each recess R1 is surrounded by the corresponding sacrificial nanostructure 121 and the corresponding channel nanostructures 122, in accordance with some embodiments.

As shown in FIGS. 1J and 1K, the removal process forms recesses R2, in accordance with some embodiments. Each recess R2 is surrounded by the cladding layer 140, the corresponding gate stack 170, the corresponding multilayer stack 120, and the isolation fins 150, in accordance with some embodiments. The recesses R2 are on opposite sides of the multilayer stack 120, in accordance with some embodiments.

The removal process includes etching processes, such as dry etching processes and wet etching processes, in accordance with some embodiments. In some embodiments, the removal process includes a first dry etching process, a first wet etching process, a second dry etching process, and a second wet etching process, which are performed sequentially. The first wet etching process uses a dilute hydrofluoric acid (HF) solution, in accordance with some embodiments. The second wet etching process uses a dilute hydrofluoric acid solution, in accordance with some embodiments.

As shown in FIG. 1K, an inner spacer structure 190 is formed in the recesses R1 and R2, in accordance with some embodiments. The inner spacer structure 190 is a continuous structure, in accordance with some embodiments. The inner spacer structure 190 is wrapped around the nanostructures 122 of the corresponding multilayer stack 120, in accordance with some embodiments.

The inner spacer structure 190 includes inner spacers 192 and 194, in accordance with some embodiments. The inner spacers 192 are in the recesses R1 of the multilayer stacks 120, in accordance with some embodiments. The inner spacers 194 are in the recesses R2, which are surrounded by the cladding layer 140, the corresponding gate stack 170, the corresponding multilayer stack 120, and the isolation fins 150, in accordance with some embodiments.

In some embodiments, the inner spacer structure 190 is made of an oxide-containing insulating material, such as silicon oxide, or a nitride-containing insulating material, such as silicon nitride (SiN), silicon oxynitride (SiON), silicon oxycarbonitride (SiOCN), or silicon carbonitride (SiCN), in accordance with some embodiments.

The formation of the inner spacer structure 190 includes forming an inner spacer material layer over the spacer 180, the mask layer M2, the dielectric fins 160, the isolation structure 130, the substrate 110, and the multilayer stacks 120 and in the recesses R1 and R2; and removing portions of the inner spacer material layer outside of the recesses R1 and R2, in accordance with some embodiments. The remaining inner spacer material layer forms the inner spacer structure 190, in accordance with some embodiments.

The inner spacer material layer is formed using a deposition process such as an atomic layer deposition (ALD) process, a chemical vapor deposition (CVD) process, or another applicable process. The removal process of the portions of the inner spacer material layer outside of the recesses R1 and R2 includes an etching process, such as a dry etching process or a wet etching process, in accordance with some embodiments.

As shown in FIG. 1K, epitaxial structures 210 are formed in the recesses 114a of the fins 114, in accordance with some embodiments. The epitaxial structures 210 are partially embedded in the isolation structure 130 and the lower portions of the fins 114, in accordance with some embodiments. The epitaxial structures 210 are made of a semiconductor material, such as SiGe, in accordance with some embodiments. The epitaxial structures 210 are formed using an epitaxial process, in accordance with some embodiments.

As shown in FIG. 1L, source/drain structures 220 are formed over the epitaxial structures 210, in accordance with some embodiments. The source/drain structures 220 are in direct contact with the nanostructures 122, in accordance with some embodiments. In some embodiments, the source/drain structures 220 are made of a semiconductor material (e.g., silicon germanium) with P-type dopants, such as the Group IIIA element, in accordance with some embodiments. The Group IIIA element includes boron or another suitable material.

In some other embodiments, the source/drain structures 220 are made of a semiconductor material (e.g., silicon) with N-type dopants, such as the Group VA element, in accordance with some embodiments. The Group VA element includes phosphor (P), antimony (Sb), or another suitable Group VA material. The source/drain structures 220 are formed using an epitaxial process, in accordance with some embodiments.

To better describe the application, a right portion A of the semiconductor device structure of FIGS. 1M-1W is omitted in FIGS. 1A-1L, 1X-1Z and 2A-2C to show cross-sectional views of the source/drain structures 220 and the fins 114, in accordance with some embodiments.

As shown in FIGS. 1L and 1M, an etch stop layer 230 is formed over the source/drain structures 220, the dielectric fins 160, and sidewalls of the spacer 180, in accordance with some embodiments. The etch stop layer 230 conformally covers the source/drain structures 220, the dielectric fins 160, and the sidewalls of the spacer 180, in accordance with some embodiments. The etch stop layer 230 is made of a dielectric material such as a nitride-containing material including silicon nitride (SiN), silicon oxynitride (SiON), or silicon carbonitride (SiCN), in accordance with some embodiments.

As shown in FIGS. 1L and 1M, a dielectric layer 240 is formed over the etch stop layer 230, in accordance with some embodiments. The etch stop layer 230 is between the dielectric layer 240 and the source/drain structures 220 to separate the dielectric layer 240 from the source/drain structures 220, in accordance with some embodiments. The etch stop layer 230 is able to protect the source/drain structures 220 from oxidation, in accordance with some embodiments.

The dielectric layer 240 is made of an insulating material such as an oxide-containing material including silicon oxide, or a nitride-containing material including silicon nitride, silicon oxynitride, silicon oxycarbonitride, or silicon carbonitride, in accordance with some embodiments.

As shown in FIGS. 1L and 1M, the mask layers M1 and M2 and upper portions of the etch stop layer 230, the dielectric layer 240, and the spacer 180 are removed, in accordance with some embodiments. The removal process includes a planarization process such as a chemical mechanical polishing process, in accordance with some embodiments.

As shown in FIG. 1M, the etch stop layer 230 and the dielectric layer 240 in the gaps G182 of the spacer 180 are partially removed to form recesses R3, in accordance with some embodiments. Each recess R3 is surrounded by the spacer 180, the etch stop layer 230, and the dielectric layer 240, in accordance with some embodiments.

As shown in FIG. 1M, a protective layer 250 is formed in the recesses R3, in accordance with some embodiments. The protective layer 250 is made of a dielectric material such as a nitride-containing material including silicon nitride (SiN), silicon oxynitride (SiON), or silicon carbonitride (SiCN), in accordance with some embodiments.

As shown in FIG. 1N, upper portions of the gate stacks 170 are removed to expose the dielectric fins 160, in accordance with some embodiments. The removal process forms recesses R4 in the spacer 180, in accordance with some embodiments. The recesses R4 expose the dielectric fins 160, in accordance with some embodiments. The removal process includes an etching process, such as a dry etching process or a wet etching process, in accordance with some embodiments.

As shown in FIG. 1O, the dielectric fins 160 are partially removed through the recesses R4 of the spacer 180, in accordance with some embodiments. The removal process includes an etching process, such as a dry etching process or a wet etching process, in accordance with some embodiments.

As shown in FIG. 1P, the remaining gate stacks 170 are removed through the recesses R4 of the spacer 180 to expose the multilayer stacks 120 and the cladding layer 140, in accordance with some embodiments. The removal process includes an etching process (e.g., a dry etching process or a wet etching process), in accordance with some embodiments.

As shown in FIG. 1Q, the sacrificial nanostructures 121 and the cladding layer 140 are removed through the recesses R4 in the spacer 180, in accordance with some embodiments. As shown in FIG. 1Q, gaps G114, G122, and G150 are formed after removing the sacrificial nanostructures 121 and the cladding layer 140, in accordance with some embodiments.

The gaps G122 are between the channel nanostructures 122, in accordance with some embodiments. The gaps G114 are between the fins 114 and the channel nanostructures 122, in accordance with some embodiments. The gaps G150 are between the isolation fins 150 and the channel nanostructures 122, in accordance with some embodiments. The removal process includes an etching process, such as a wet etching process or a dry etching process, in accordance with some embodiments.

As shown in FIG. 1R, a gate dielectric layer 262 is conformally formed over the channel nanostructures 122 and the fins 114 exposed by the recesses R4 in the spacer 180, in accordance with some embodiments. The gate dielectric layer 262 is further conformally formed over the inner spacer structure 190, the spacer 180, the isolation fins 150, and the isolation structure 130, in accordance with some embodiments.

The gate dielectric layer 262 is made of a dielectric material such as an oxide material (e.g., silicon oxide) or a high-K material, such as $HfO_2$, $ZrO_2$, $HfZrO_2$, or $Al_2O_3$, in accordance with some embodiments. The gate dielectric layer 262 is formed using a deposition process, such as a chemical vapor deposition process or a physical vapor deposition process, or another suitable process, in accordance with some embodiments.

As shown in FIG. 1R, a gate electrode structure 264 is formed over the gate dielectric layer 262, in accordance with some embodiments. In one of the recesses R4, the gate dielectric layer 262 and the gate electrode structure 264 together form a gate stack 260, in accordance with some embodiments.

The gate electrode structure 264 includes a work function metal layer (not shown) and a gate electrode (not shown), in accordance with some embodiments. The work function metal layer is conformally formed over the gate dielectric layer 262, in accordance with some embodiments. The gate electrode is formed over the work function metal layer, in accordance with some embodiments.

The work function metal layer is made of titanium-containing material (e.g., TiN or TiSiN) or tantalum-containing material (e.g., TaN), or another suitable conductive material. The work function metal layer is formed using an atomic layer deposition process, a chemical vapor deposition process, a physical vapor deposition process, or another suitable process.

The gate electrode is made of W, Co, Al, or another suitable conductive material. The gate electrode is formed using a physical vapor deposition process, an atomic layer deposition process, or another suitable process.

As shown in FIGS. 1Q and 1R, the protective layer 250 and upper portions of the spacer 180 and the gate stacks 260 are removed, in accordance with some embodiments. Each gate stack 260 is wrapped around the corresponding channel nanostructures 122, in accordance with some embodiments. In some embodiments, a portion of the gate stack 260 is between the corresponding channel nanostructure 122 and the corresponding fin 114.

The removal process includes a planarization process such as a chemical mechanical polishing process, in accordance with some embodiments. Therefore, after the removal process, the top surfaces 242, 181, 232, and 260a of the dielectric layer 240, the spacer 180, the etch stop layer 230, and the gate stack 260 are substantially level with each other, in accordance with some embodiments. The surface 260a faces away from the substrate 110, in accordance with some embodiments.

As shown in FIG. 1S, upper portions of the gate stack 260 and the spacer 180 are removed, in accordance with some embodiments. After the removal process, the top surfaces 181 and 260a of the spacer 180 and the gate stack 260 are lower than the top surfaces 232 and 242 of the etch stop layer 230 and the dielectric layer 240, in accordance with some embodiments. The removal process forms recesses R5 in the etch stop layer 230, in accordance with some embodiments. The removal process includes an etching process such as a dry etching process or a wet etching process, in accordance with some embodiments.

As shown in FIG. 1T, a cap layer 270 is formed over the gate stacks 260, in accordance with some embodiments. The cap layer 270 is made of a conductive material, such as W, Mo, Ru, or Co, in accordance with some embodiments. In some embodiments, the (average) thickness T270 of the cap layer 270 ranges from about 4 nm to about 25 nm.

As shown in FIG. 1U, a liner layer 280 is formed in the recesses R5 of the etch stop layer 230, in accordance with some embodiments. In some embodiments, the thickness T280 of the liner layer 280 ranges from about 1 nm to about 8 nm. The liner layer 280 is made of nitrides (e.g., silicon nitride or silicon carbon nitride), in accordance with some embodiments.

As shown in FIG. 1U, a dielectric layer 290 is formed over the liner layer 280 in the recesses R5, in accordance with some embodiments. The dielectric layer 290 is made of an oxide material (e.g., SiOC, $Al_2O_3$, AlON, ZrO, HfO, $TiO_2$, ZrAlO, ZnO, SiOCN, or SiOCN) or a nitride material (e.g., SiCN or SiN), in accordance with some embodiments.

As shown in FIG. 1V, portions of the dielectric layer 240 are removed to form through holes TH in the dielectric layer 240, in accordance with some embodiments. The through holes TH expose the source/drain structures 220, in accordance with some embodiments. The removal process includes an etching process such as a dry etching process, in accordance with some embodiments.

As shown in FIG. 1V, contact structures 310 are formed in the through holes TH of the dielectric layer 240, in accordance with some embodiments. The contact structures 310 are made of a conductive material, such as W, Ru, Mo, or Co, in accordance with some embodiments. In some embodiments, a barrier layer (not shown) is formed between the contact structures 310 and the dielectric layer 240 and between the contact structures 310 and the etch stop layer 230, in accordance with some embodiments. The barrier layer is made of TaN or TiN, in accordance with some embodiments.

The dielectric layer 290 has a wide portion 294 and a narrow portion 296, in accordance with some embodiments. The width W294 of the wide portion 294 ranges from about 5 nm to about 50 nm, in accordance with some embodiments. The width W296 of the narrow portion 296 ranges from about 4 nm to about 25 nm, in accordance with some embodiments. The thickness T294 of the wide portion 294 ranges from about 4 nm to about 25 nm, in accordance with some embodiments. The thickness T296 of the narrow portion 296 ranges from about 4 nm to about 25 nm, in accordance with some embodiments.

As shown in FIGS. 1V and 1W, a dielectric layer 320 is formed over the contact structures 310, the liner layer 280, and the dielectric layer 290, in accordance with some embodiments. The dielectric layer 320 is made of oxides (e.g., silicon oxide), nitrides (e.g., silicon nitride), fluorosilicate glass (FSG), a low-k dielectric material, or another suitable dielectric material, in accordance with some embodiments. The dielectric layer 320 may be formed by a chemical vapor deposition process, an atomic layer deposition process, a physical vapor deposition (PVD) process, or another applicable process.

In some embodiments, devices (not shown) are formed in the dielectric layer 320. The devices include wiring layers, conductive vias, passive devices, other suitable elements, or a combination thereof, in accordance with some embodiments. The passive devices include resistors, capacitors, or other suitable passive devices.

As shown in FIG. 1X, the substrate 110 is turned upside down, in accordance with some embodiments. As shown in FIG. 1X, the base 112 and portions of the isolation structure 130 are removed to expose the isolation structure 130 and the fins 114, in accordance with some embodiments. The removal process includes a planarization process such as a chemical mechanical polishing process, in accordance with some embodiments. Therefore, after the removal process, the top surfaces 131 and 114a of the isolation structure 130 and the fins 114 are substantially level with each other, in accordance with some embodiments.

As shown in FIG. 1Y, a mask layer M3 is formed over the isolation structure 130 and the fins 114, in accordance with some embodiments. In some embodiments, the mask layer M3 is made of a nitride-containing insulating material (e.g., silicon nitride, silicon oxynitride, silicon oxycarbonitride, or silicon carbonitride) or silicon carbide.

In some embodiments, the mask layer M3 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, an atomic layer deposition process, a physical vapor deposition (PVD) process, or another applicable process.

As shown in FIG. 1Y, a mask layer M4 is formed over the mask layer M3, in accordance with some embodiments. The mask layers M3 and M4, the isolation structure 130, and the fins 114 are made of different materials, in accordance with some embodiments. In some embodiments, the mask layer M4 is made of a polymer material, such as a photoresist material. The mask layer M4 is formed using a spin-on process, in accordance with some embodiments.

As shown in FIG. 1Y, the mask layer M4 is patterned to form openings OP2 in the mask layer M4, in accordance with some embodiments. The openings OP2 expose portions of the mask layer M3, in accordance with some embodiments. The mask layer M4 is patterned using a photolithography process, in accordance with some embodiments.

As shown in FIG. 1Y, the exposed portions of the mask layer M3 are removed through the openings OP2 to form openings OP1 in the mask layer M3, in accordance with some embodiments. The openings OP1 and OP2 expose portions of the fins 114, in accordance with some embodiments. The exposed portions of the mask layer M3 are removed using an etching process such as a dry etching process or a wet etching process, in accordance with some embodiments.

As shown in FIG. 1Y, the exposed portions of the fins 114 are removed through the openings OP1 and OP2 of the mask layers M3 and M4, in accordance with some embodiments. The removal process includes an etching process such as a dry etching process or a wet etching process, in accordance with some embodiments.

As shown in FIGS. 1X and 1Y, the epitaxial structures 210 originally under the removed portions of the fins 114 are removed to form recesses 116 in the substrate 110, in accordance with some embodiments. The recesses 116 expose the source/drain structures 220, in accordance with some embodiments. The removal process includes an etching process such as a dry etching process or a wet etching process, in accordance with some embodiments.

As shown in FIG. 1Z, a liner layer 330 is formed over sidewalls 116a of the recesses 116, in accordance with some embodiments. In some embodiments, a thickness T330 of the liner layer 330 ranges from about 2 nm to about 10 nm, in accordance with some embodiments. The liner layer 330 is made of a nitride material such as SiN, SiCN, or SiOCN, in accordance with some embodiments. The liner layer 330 is formed using a deposition process and an etching process, in accordance with some embodiments. The liner layer 330 may be deposited using an atomic layer deposition (ALD) process, a chemical vapor deposition (CVD) process, or another applicable process.

Figure 2A:
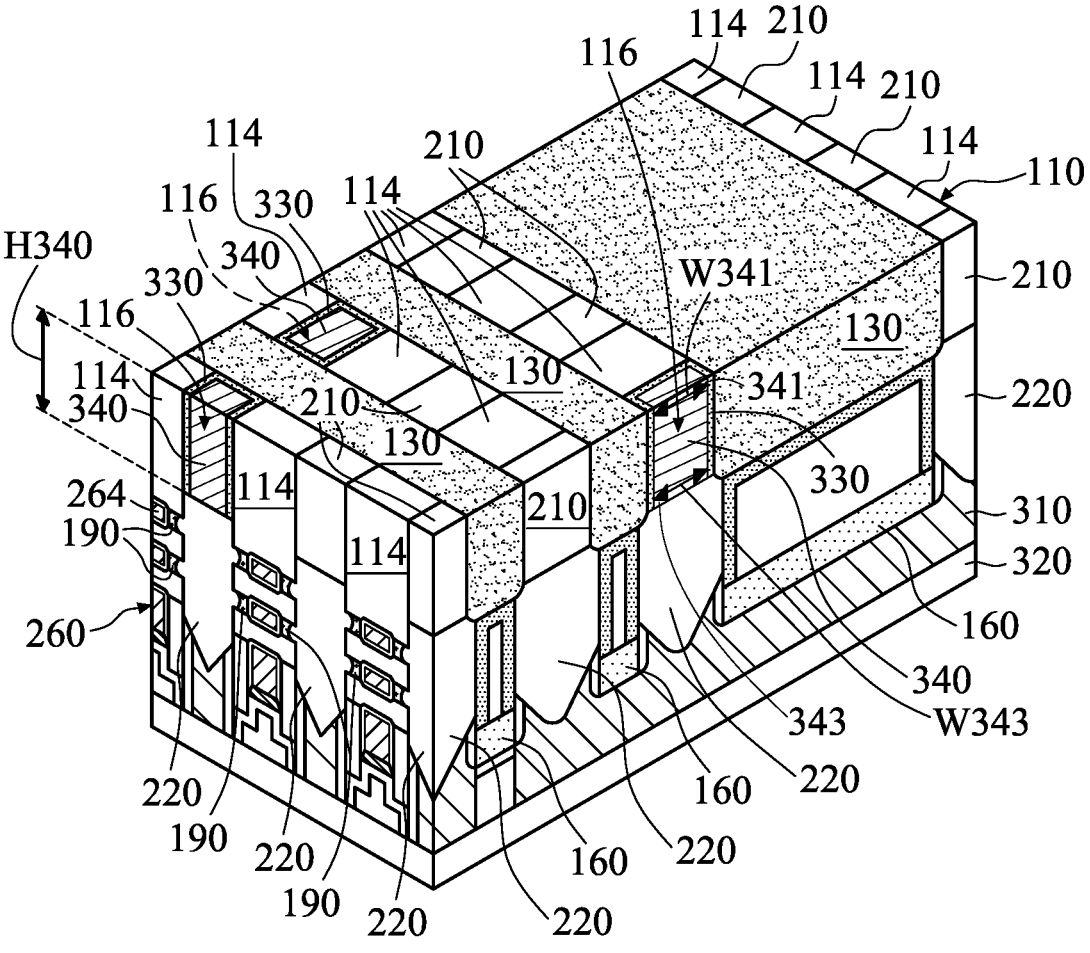
FIGS. 2A-2J are perspective views of various stages of a process for forming a semiconductor device structure, in accordance with some embodiments.

FIGS. 2A-2J are perspective views of various stages of a process for forming a semiconductor device structure, in accordance with some embodiments. As shown in FIG. 2A, contact structures 340 are formed in the recesses 116 of the substrate 110, in accordance with some embodiments. Each contact structure 340 has a top portion 341 and a bottom portion 343, in accordance with some embodiments. The top portion 341 is wider than the bottom portion 343, in accordance with some embodiments.

The width W341 of the top portion 341 ranges from about 5 nm to about 25 nm, in accordance with some embodiments. The width W343 of the bottom portion 343 ranges from about 4 nm to about 20 nm, in accordance with some embodiments. The height H340 of the contact structure 340 ranges from about 10 nm to about 30 nm, in accordance with some embodiments.

The contact structures 340 are made of a conductive material, such as W, Ru, Mo, or Co, in accordance with some embodiments. In some embodiments, a barrier layer (not shown) is formed between the contact structures 340 and the liner layer 330, in accordance with some embodiments. The barrier layer is made of TaN or TiN, in accordance with some embodiments.

As shown in FIG. 2A, upper portions of the fins 114, the isolation structure 130, the liner layer 330, and the contact structures 340 are removed, in accordance with some embodiments. The removal process includes a planarization process such as a chemical mechanical polishing process, in accordance with some embodiments.

Figure 2B:
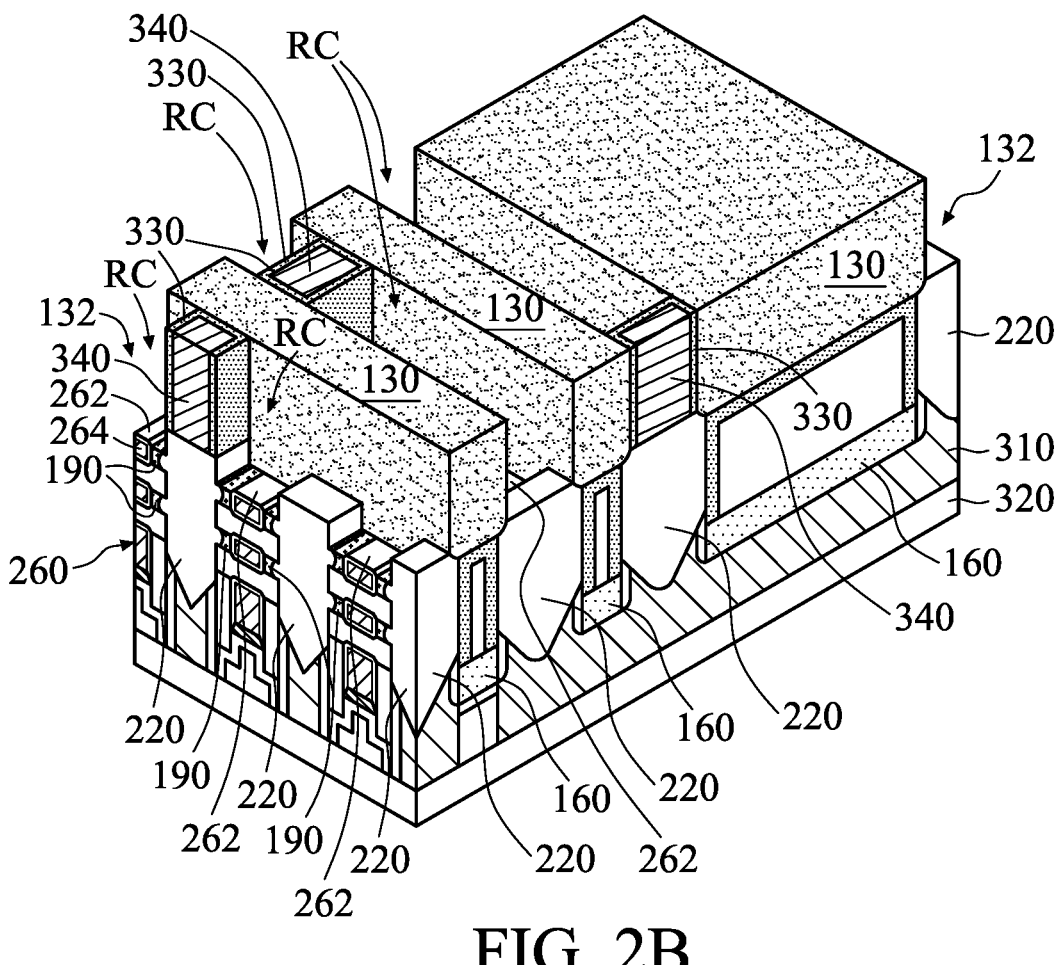

As shown in FIG. 2B, the fins 114 and the epitaxial structures 210 are removed to form recesses RC, in accordance with some embodiments. The recesses RC surrounded by the isolation structure 130, the liner layer 330, the gate stacks 260, and the inner spacer structure 190, in accordance with some embodiments. The removal process includes an etching process such as a dry etching process or a wet etching process, in accordance with some embodiments.

Figure 2C:
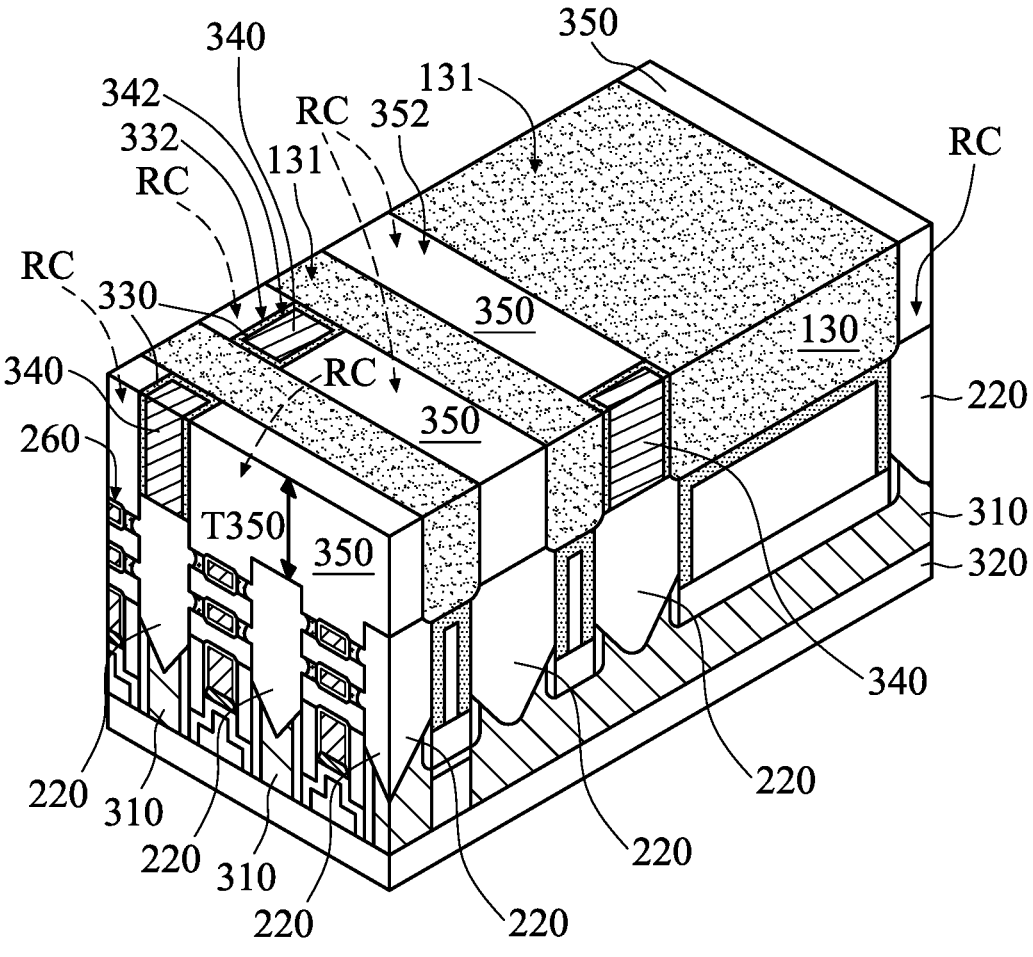

As shown in FIG. 2C, a dielectric layer 350 is formed in the recesses RC, in accordance with some embodiments. The dielectric layer 350 is made of SiOC, Al₂O₃, AlON, ZrO, HfO, TiO₂, ZrAlO, ZnO, SiOCN, SiOCN, SiCN, SiN, or SiO₂, in accordance with some embodiments. In some embodiments, the thickness T350 of the dielectric layer 350 ranges from about 10 nm to about 50 nm.

The dielectric layer 350 is formed using a deposition process and a planarization process, in accordance with some embodiments. The deposition process includes an atomic layer deposition (ALD) process, a chemical vapor deposition (CVD) process, or another applicable process. The planarization process includes a chemical mechanical polishing process, in accordance with some embodiments. The top surfaces 131, 352, 332, and 342 of the isolation structure 130, the dielectric layer 350, the liner layer 330, and the contact structures 340 are substantially level with each other, in accordance with some embodiments.

Figure 2D:
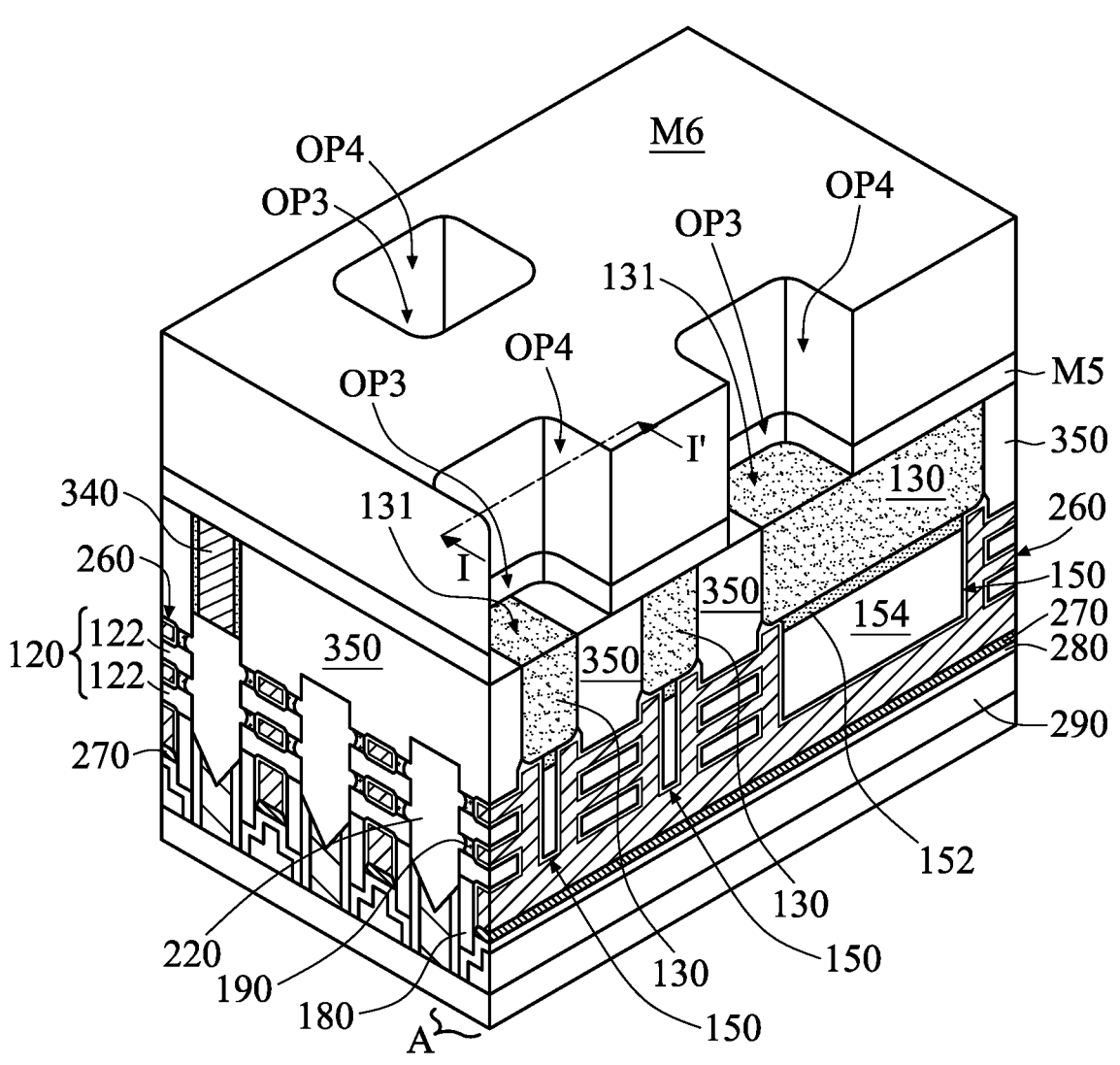
Figure 2E:
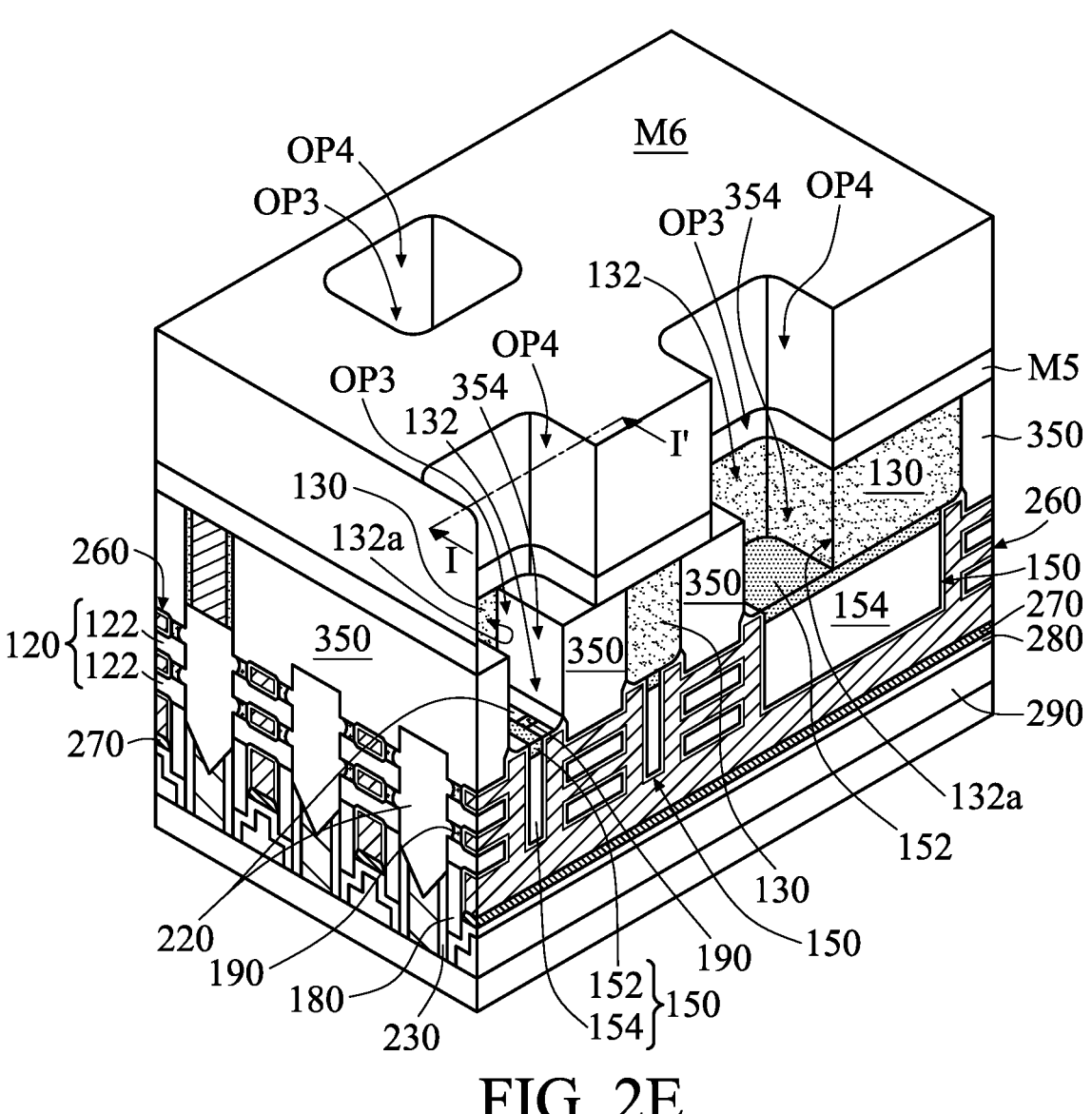
Figures 1, 2E:
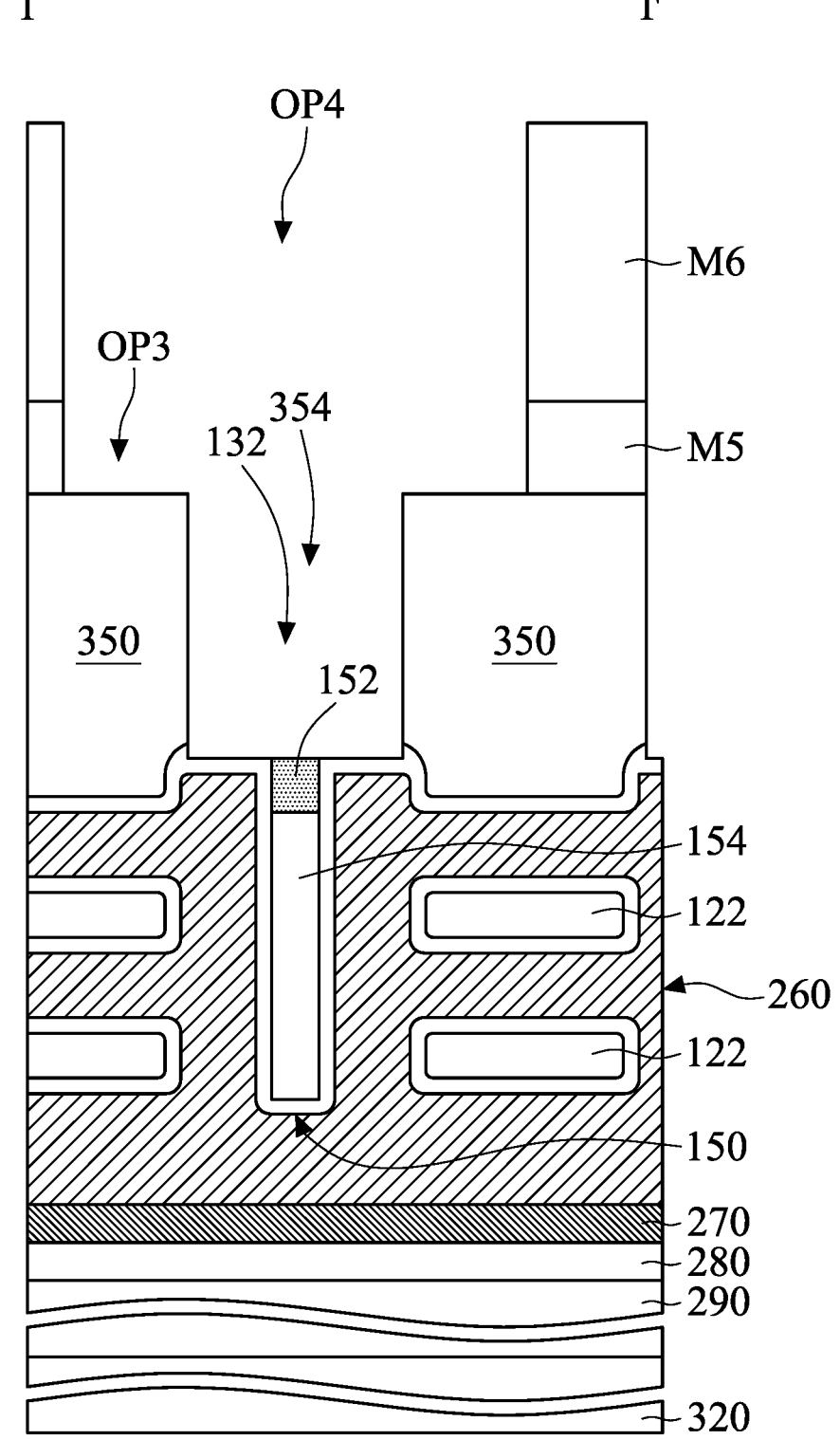
Figure 2F:
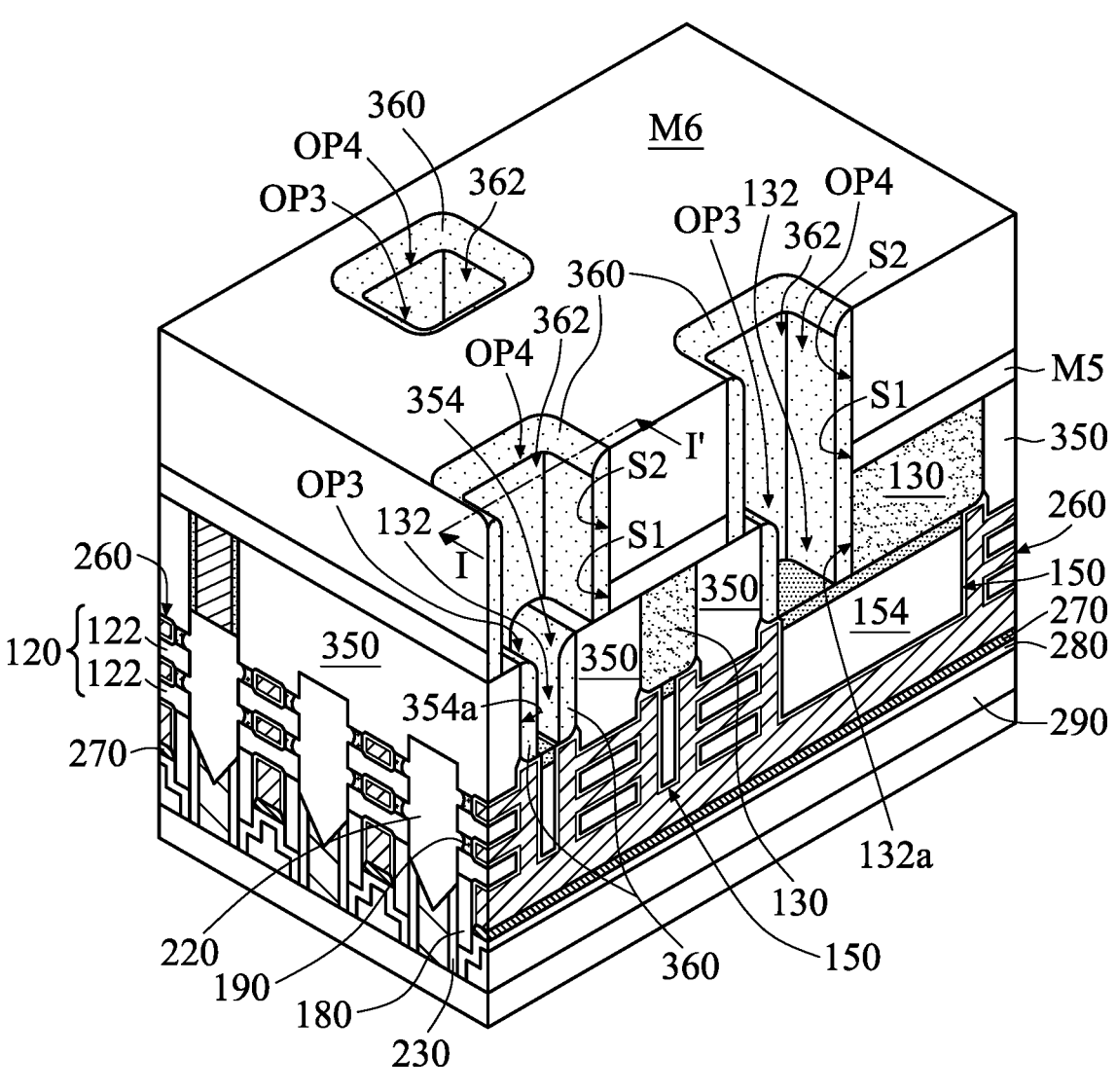
Figures 1, 2F:
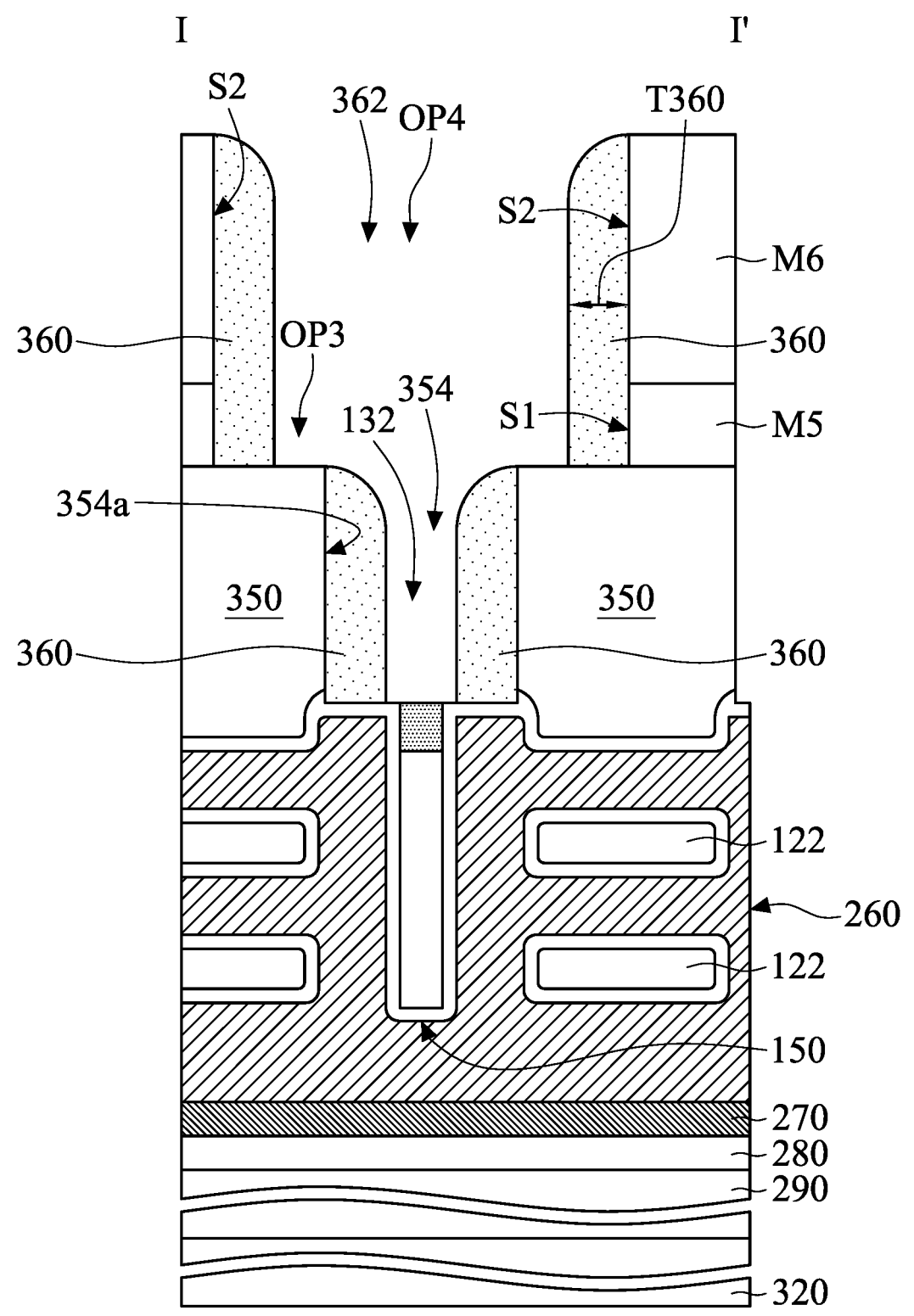
Figure 2G:
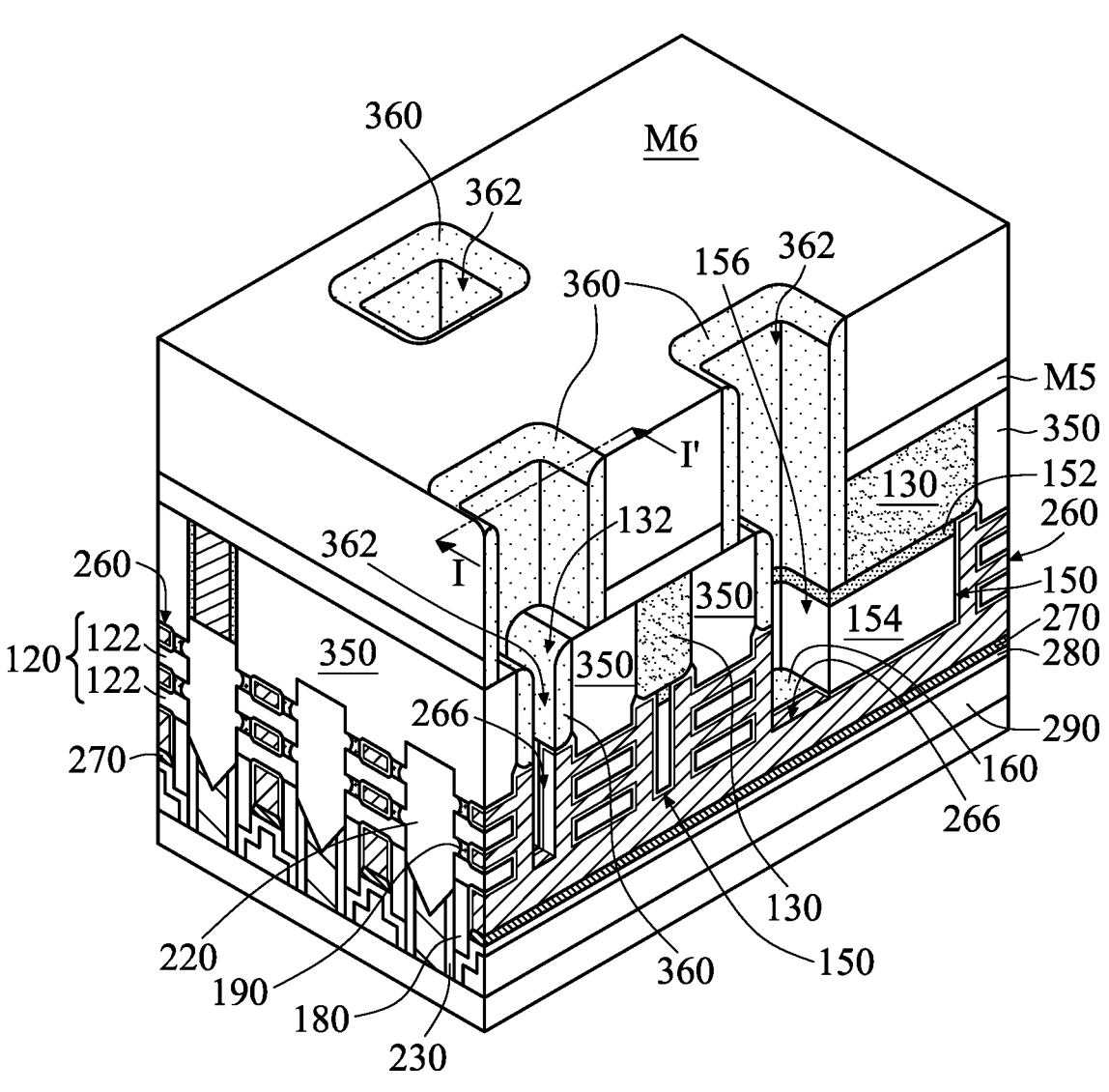
Figures 1, 2G:
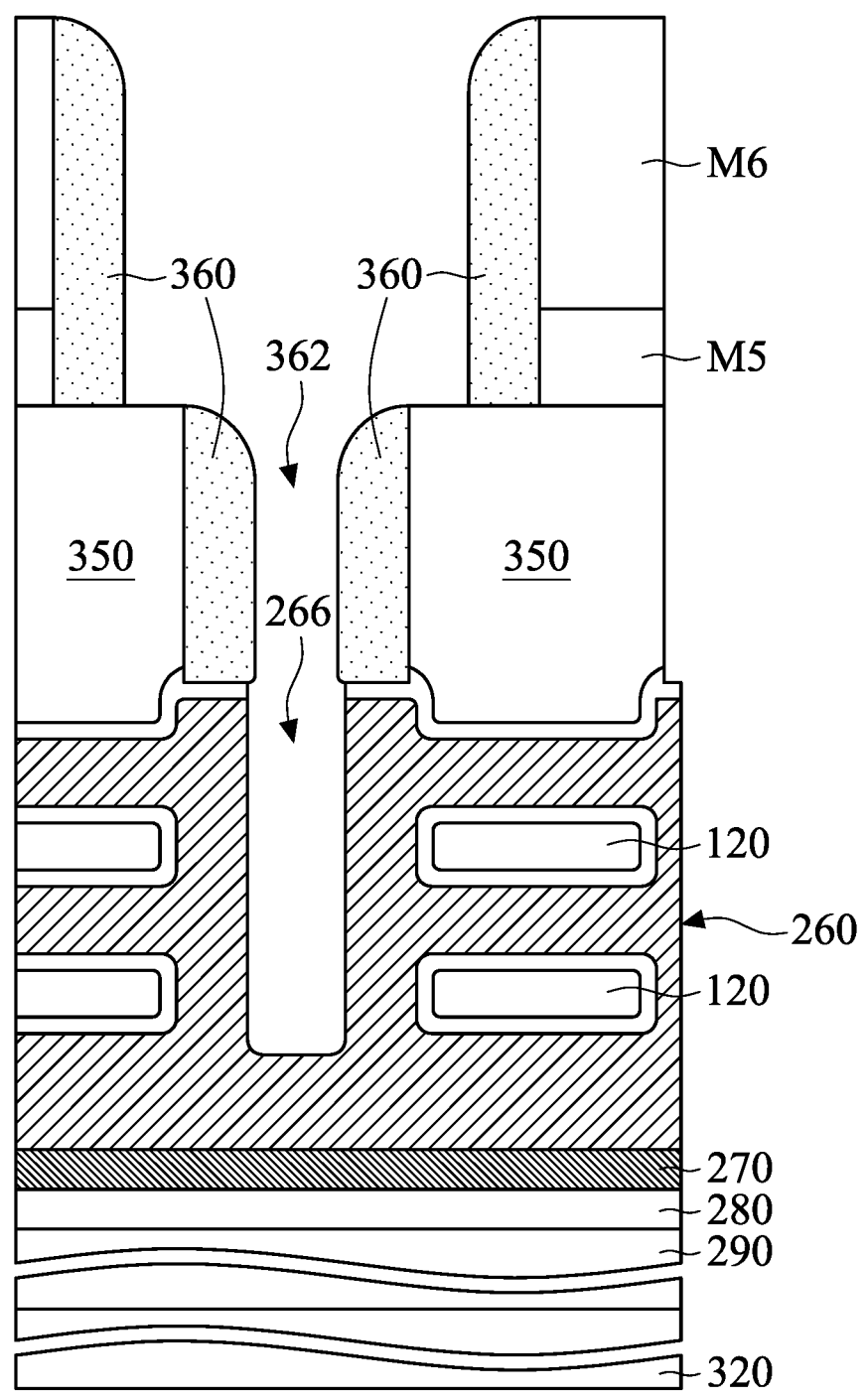
Figure 2H:
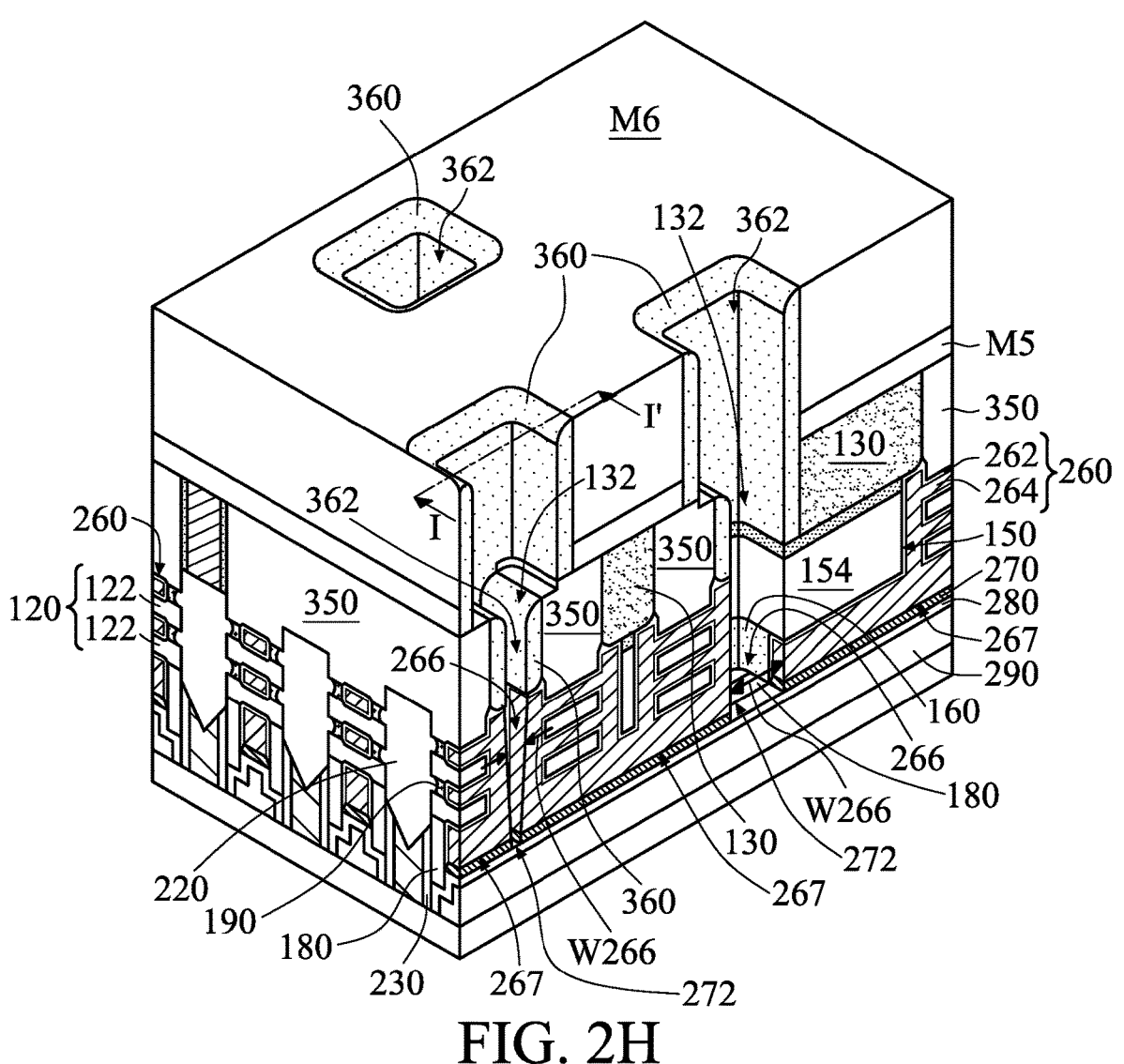
Figures 1, 2H:
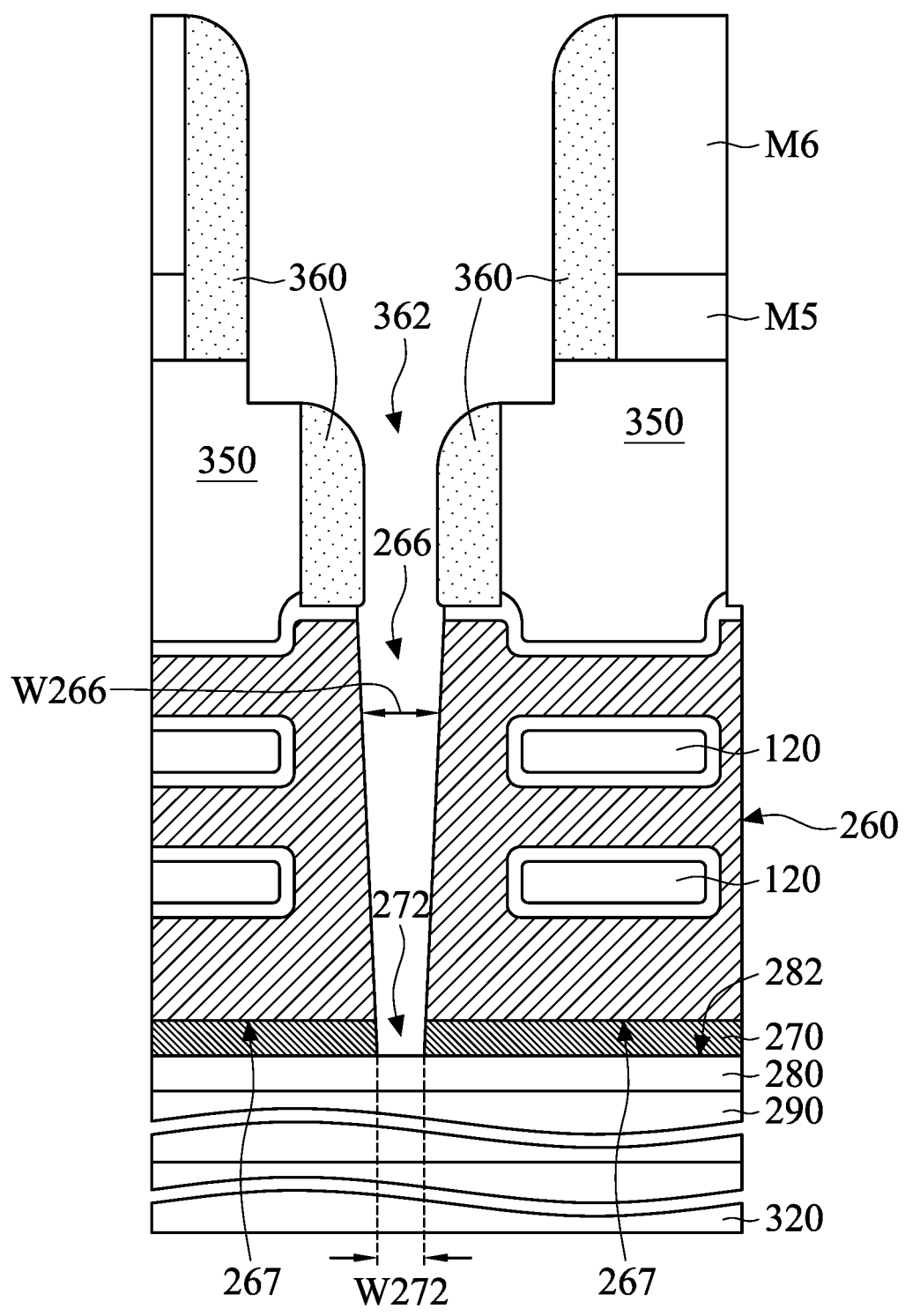
Figure 2I:
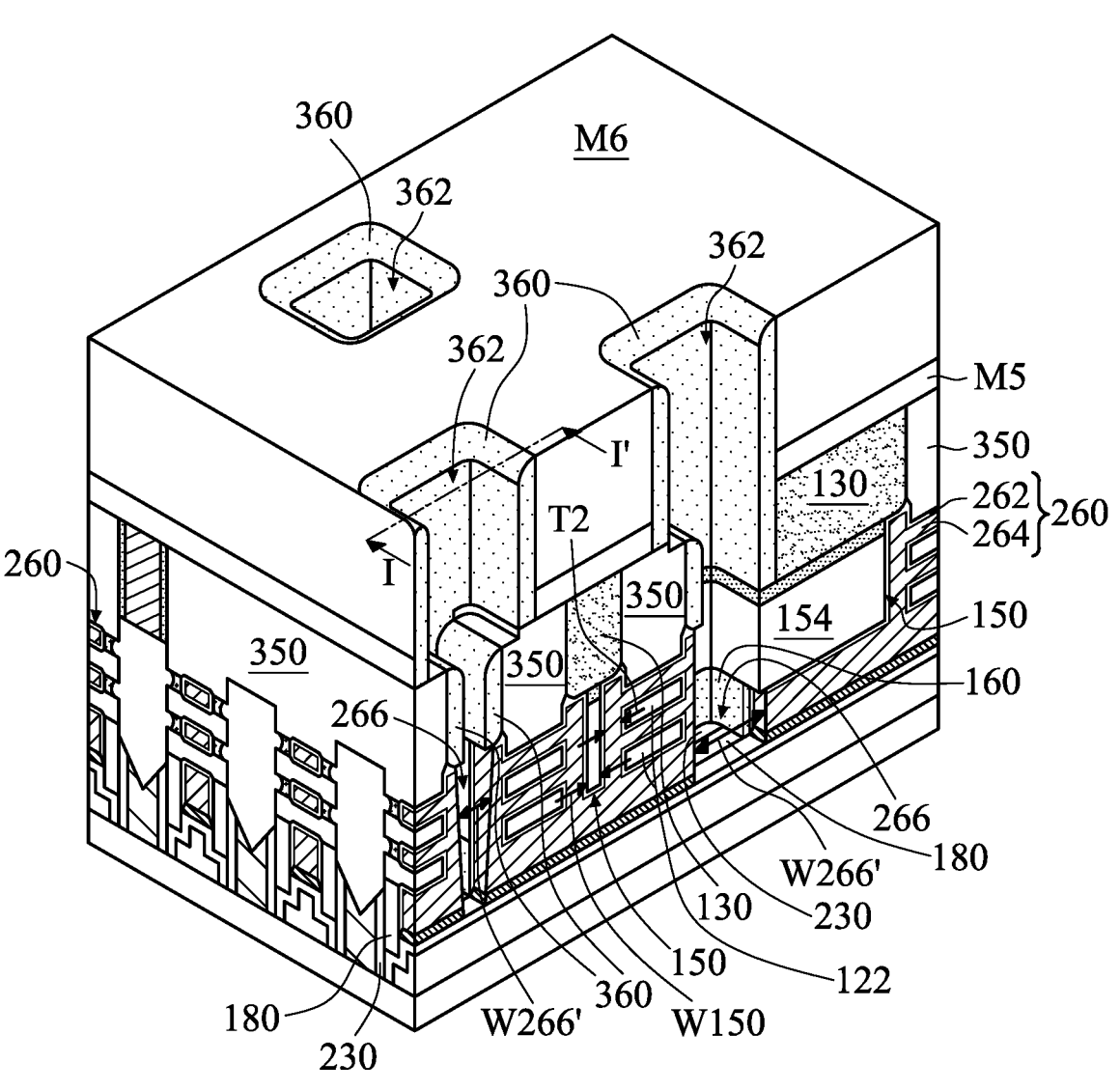
Figures 1, 2I:
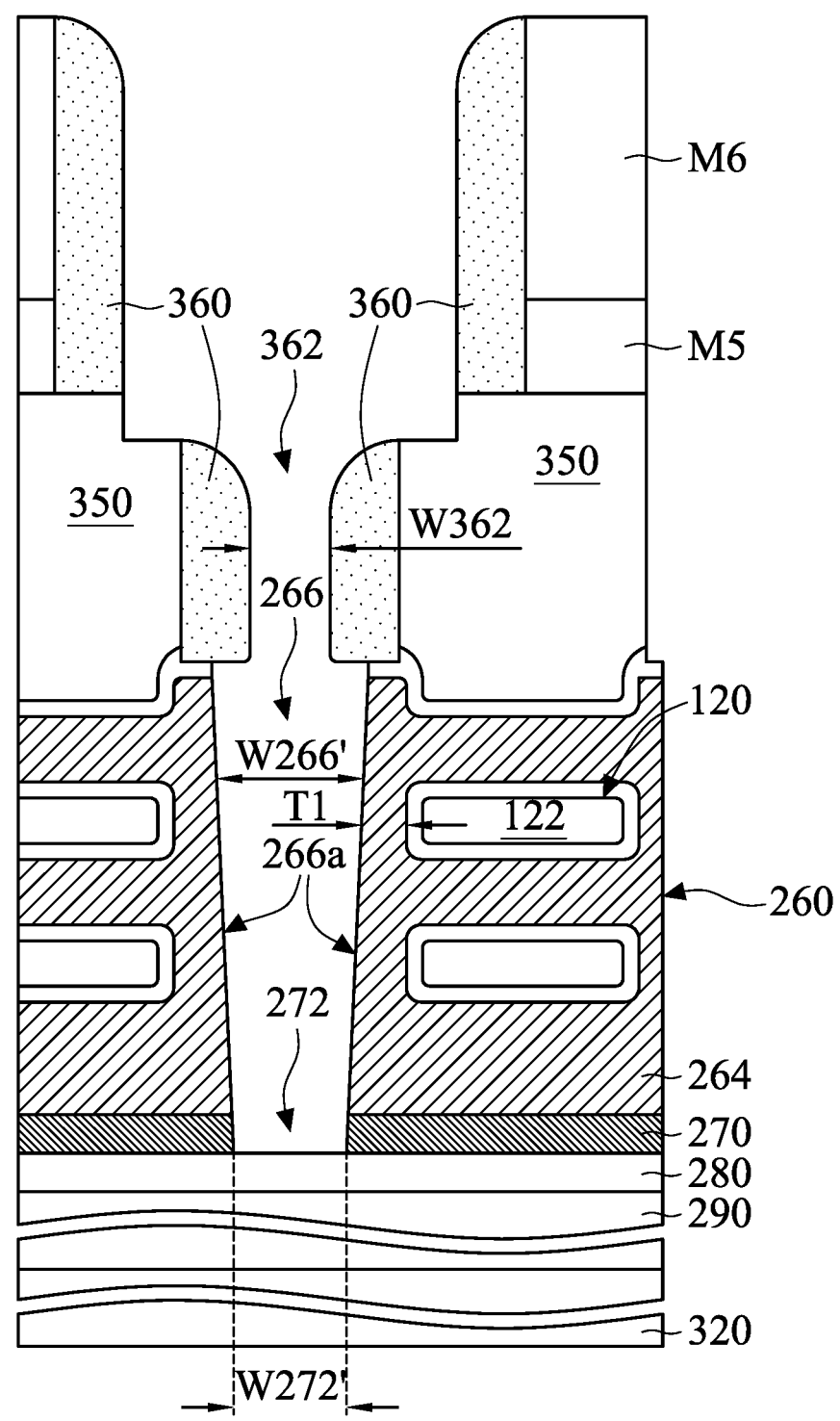
Figure 2J:
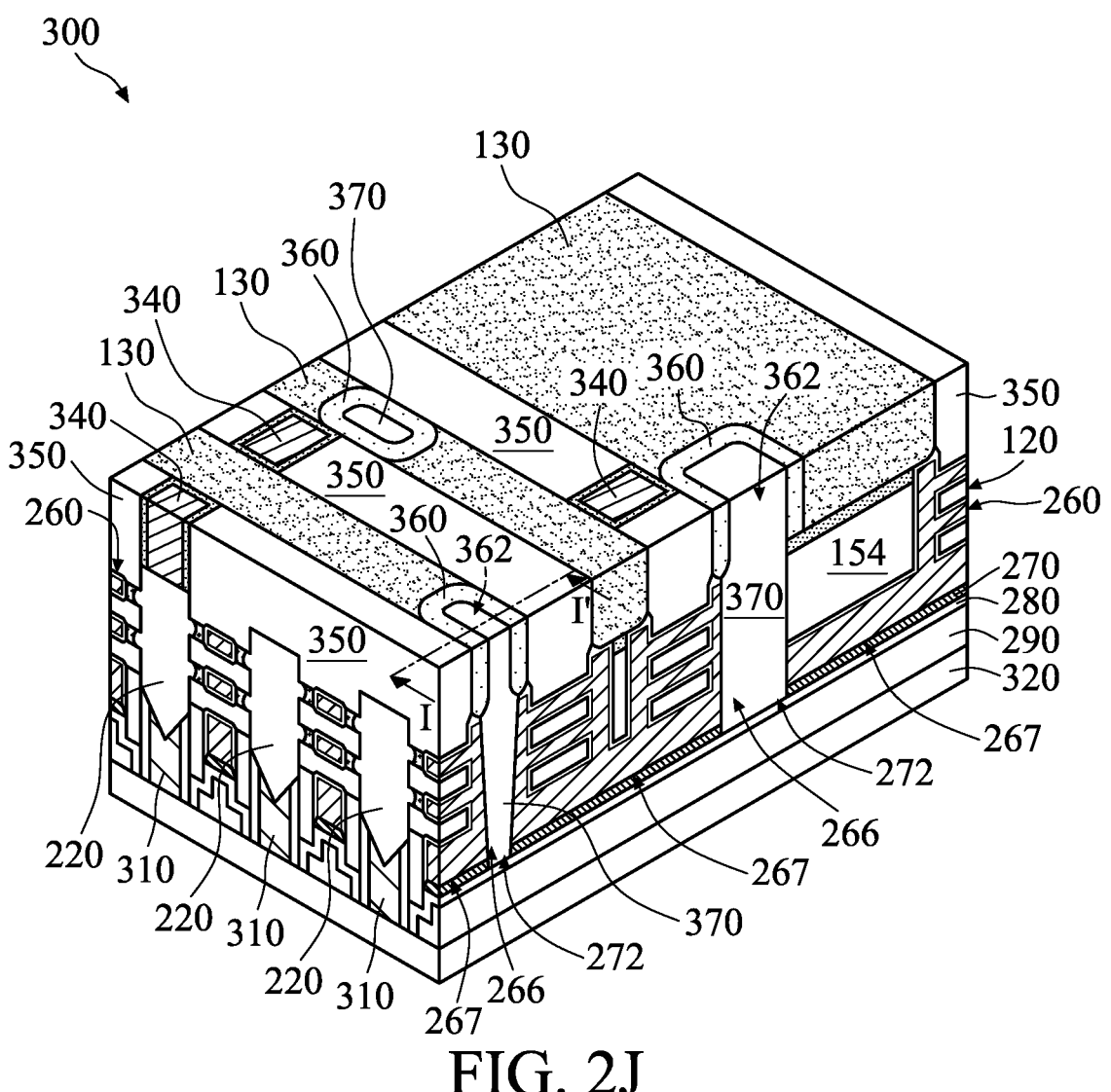
Figures 1, 2J:
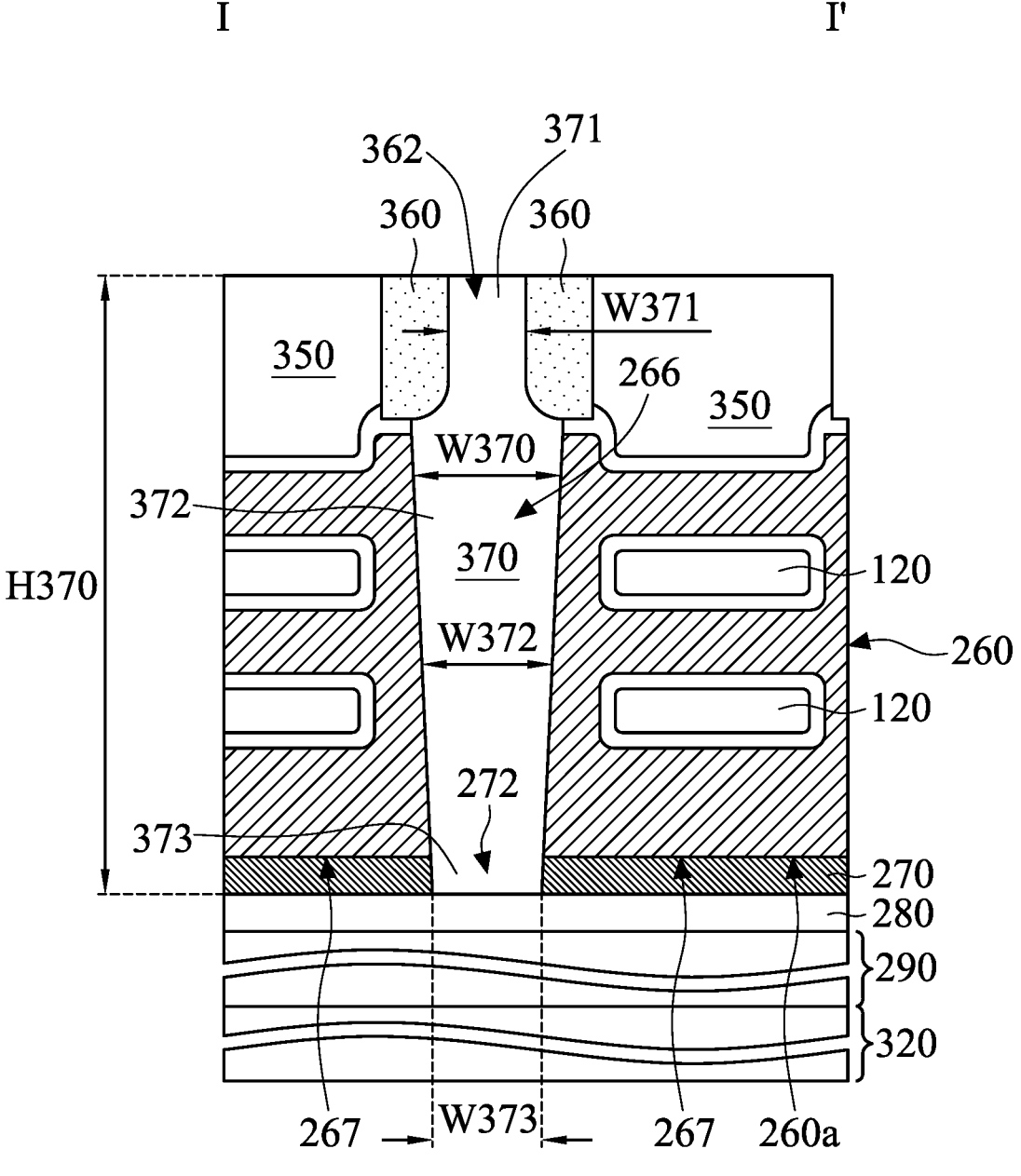

FIGS. 2D-1 to 2J-1 are cross-sectional views illustrating the semiconductor device structure along a sectional line I-I' in FIGS. 2D-2J, in accordance with some embodiments. As shown in FIGS. 2D and 2D-1, a mask layer M5 is formed over the isolation structure 130, the dielectric layer 350, the liner layer 330, and the contact structures 340, in accordance with some embodiments. The mask layer M5 is made of a semiconductor material (e.g., silicon) or a nitride material (e.g., TiN), in accordance with some embodiments.

As shown in FIGS. 2D and 2D-1, a mask layer M6 is formed over the mask layer M5, in accordance with some embodiments. The mask layer M6 is made of a nitride material (e.g., SiN), in accordance with some embodiments. As shown in FIGS. 2D and 2D-1, the mask layer M6 is patterned to form openings OP4 in the mask layer M6, in accordance with some embodiments. The openings OP4 expose portions of the mask layer M5, in accordance with some embodiments.

As shown in FIGS. 2D and 2D-1, the exposed portions of the mask layer M5 are removed through the openings OP4 to form openings OP3 in the mask layer M5, in accordance with some embodiments. The openings OP3 expose portions of the isolation structure 130, in accordance with some embodiments. The removal process includes an etching process such as a dry etching process, in accordance with some embodiments.

As shown in FIGS. 2E and 2E-1, the exposed portions of the isolation structure 130 are removed through the openings OP3 and OP4 of the mask layers M5 and M6 to form trenches 132 in the isolation structure 130 and trenches 354 in the dielectric layer 350, in accordance with some embodiments. The trenches 132 expose portions of the isolation fins 150, in accordance with some embodiments. The trenches 132 in the isolation structure 130 pass through the dielectric layer 350, in accordance with some embodiments. The removal process includes an etching process such as a dry etching process, in accordance with some embodiments.

As shown in FIGS. 2F and 2F-1, a spacer layer 360 is formed over inner walls 132a, S1, S2, and 354a of the trenches 132, the openings OP3 and OP4, the trenches 354, in accordance with some embodiments. The spacer layer 360 has openings 362 exposing the isolation fins 150, in accordance with some embodiments.

The thickness T360 of the spacer layer 360 ranges from about 3 nm to about 10 nm, in accordance with some embodiments. The spacer layer 360 is made of a nitride material (e.g., SiN, SiCON, or SiCN) or a carbide material (e.g., SiCO), in accordance with some embodiments.

As shown in FIGS. 2G and 2G-1, portions of the isolation fins 150 are removed through the openings 362 to form trenches 156 in the isolation fins 150 and trenches 266 in the gate stacks 260, in accordance with some embodiments. The trenches 156 expose portions of the gate stacks 260, in accordance with some embodiments. The removal process includes an etching process such as a dry etching process, in accordance with some embodiments.

As shown in FIGS. 2H and 2H-1, portions of the gate stack 260 are removed through the trenches 132 and 266 and the openings 362, in accordance with some embodiments.

After the removal process, the trenches 266 pass through the gate stacks 260, in accordance with some embodiments. The trenches 266 divide each gate stacks 260 into parts 267, in accordance with some embodiments. The parts 267 are spaced apart from each other, in accordance with some embodiments. The removal process includes an etching process such as a dry etching process, in accordance with some embodiments.

The gate stack 260 is cut into the parts 267 by removing the portion of the isolation fin 150 and the portion of the gate stack 260 originally under the portion of the isolation fin 150, in accordance with some embodiments. Therefore, the gate stack 260 is cut into the parts 267 using a self-aligned removal process, such as a self-aligned etching process, in accordance with some embodiments.

As a result, the etching depth of the self-aligned etching process is controllable by adjusting the thickness of the isolation fin 150, in accordance with some embodiments. Since the portion of the gate stack 260 originally under the portion of the isolation fin 150 is thin, it is easy to control the etching process for removing the portion of the gate stack 260, which prevents the devices in the dielectric layer 320 from being over-etched, in accordance with some embodiments.

As shown in FIGS. 2H and 2H-1, portions of the cap layer 270 are removed through the trenches 132 and 266 and the openings 362 to form trenches 272 passing through the cap layer 270, in accordance with some embodiments. The removal process includes an etching process such as a dry etching process, in accordance with some embodiments.

As shown in FIGS. 2H, 2I and 2I-1, portions of the gate stacks 260 are removed from the inner walls 266a of the trenches 266 of the gate stacks 260 to widen the trenches 266, in accordance with some embodiments. The width W266' of the trench 266 of FIGS. 2I and 2I-1 is greater than the width W266 of the corresponding trench 266 of FIGS. 2H and 2H-1, in accordance with some embodiments. The removal process includes an etching process such as a dry etching process or a wet etching process, in accordance with some embodiments.

The removal process for removing the portions of the gate stack 260 from the inner walls 266a thins the portion of the gate electrode structure 264 of the gate stack 260 between the trench 266 and the nanostructures 122, in accordance with some embodiments. Therefore, the thickness T1 of the portion of the gate electrode structure 264 between the trench 266 and the nanostructures 122 is less than the thickness T2 of the portion of the gate electrode structure 264 between the isolation fin 150 and the nanostructures 122, in accordance with some embodiments.

Therefore, the removal process may reduce the lengths of the parts 267 of the gate stack 260, which may reduce the parasitic capacitance between the gate stack 260 and contact structures formed in subsequent process and connected to the source/drain structures 220.

As shown in FIGS. 2J and 2J-1, dielectric structures 370 are formed in the openings 362 of the spacer layer 360, the trenches 266 of the gate stacks 260, and the trenches 272 of the cap layer 270, in accordance with some embodiments. The height H370 of the dielectric structure 370 ranges from about 50 nm to about 150 nm, in accordance with some embodiments. The dielectric structures 370 are made of a nitride material (e.g., SiN or SiCON) or a carbide material (e.g., SiOC), in accordance with some embodiments. In some embodiments, a height H370 of the dielectric structures 370 ranges from about 50 nm to 150 nm, in accordance with some embodiments.

In some embodiments, the width W370 of the dielectric structure 370 decreases toward the surface 260a of the gate stack 260. The width W370 ranges from about 5 nm to 50 nm, in accordance with some embodiments. The dielectric structures 370 pass through the dielectric layer 350 and separate different parts 267 of the gate stacks 260, in accordance with some embodiments.

The dielectric structures 370 in the openings 362 of the spacer layer 360 is narrower than the dielectric structures 370 in the trenches 266 of the gate stack 260, in accordance with some embodiments. The dielectric structure 370 in the dielectric layer 350 is narrower than the dielectric structure 370 between the parts 267, in accordance with some embodiments.

Each dielectric structure 370 has a top portion 371, a middle portion 372, and a bottom portion 373, in accordance with some embodiments. The middle portion 372 is between the top portion 371 and the bottom portion 373, in accordance with some embodiments. The top portion 371 is in the openings 362 of the spacer layer 360, in accordance with some embodiments. The middle portion 372 is in the trench 266 of the gate stack 260, in accordance with some embodiments.

The bottom portion 373 is in the trench 272 of the cap layer 270, in accordance with some embodiments. The width W372 of the middle portion 372 is greater than the width W371 of the top portion 371, in accordance with some embodiments. The width W372 of the middle portion 372 is greater than the width W373 of the bottom portion 373, in accordance with some embodiments.

The spacer layer 360 is in direct contact with the dielectric structures 370, in accordance with some embodiments. The spacer layer 360 is between the dielectric structures 370 and the dielectric layer 350 to separate the dielectric structures 370 from the dielectric layer 350, in accordance with some embodiments. In this step, a semiconductor device structure 300 is substantially formed, in accordance with some embodiments.

Since the method of the application reduces the parasitic capacitance of the semiconductor device structure 300, the performance of the semiconductor device structure 300 is improved, in accordance with some embodiments. Since the method of the application prevents the devices in the dielectric layer 320 from being over-etched, the yield and the reliability of the semiconductor device structure 300 are improved, in accordance with some embodiments.

Figure 3A:
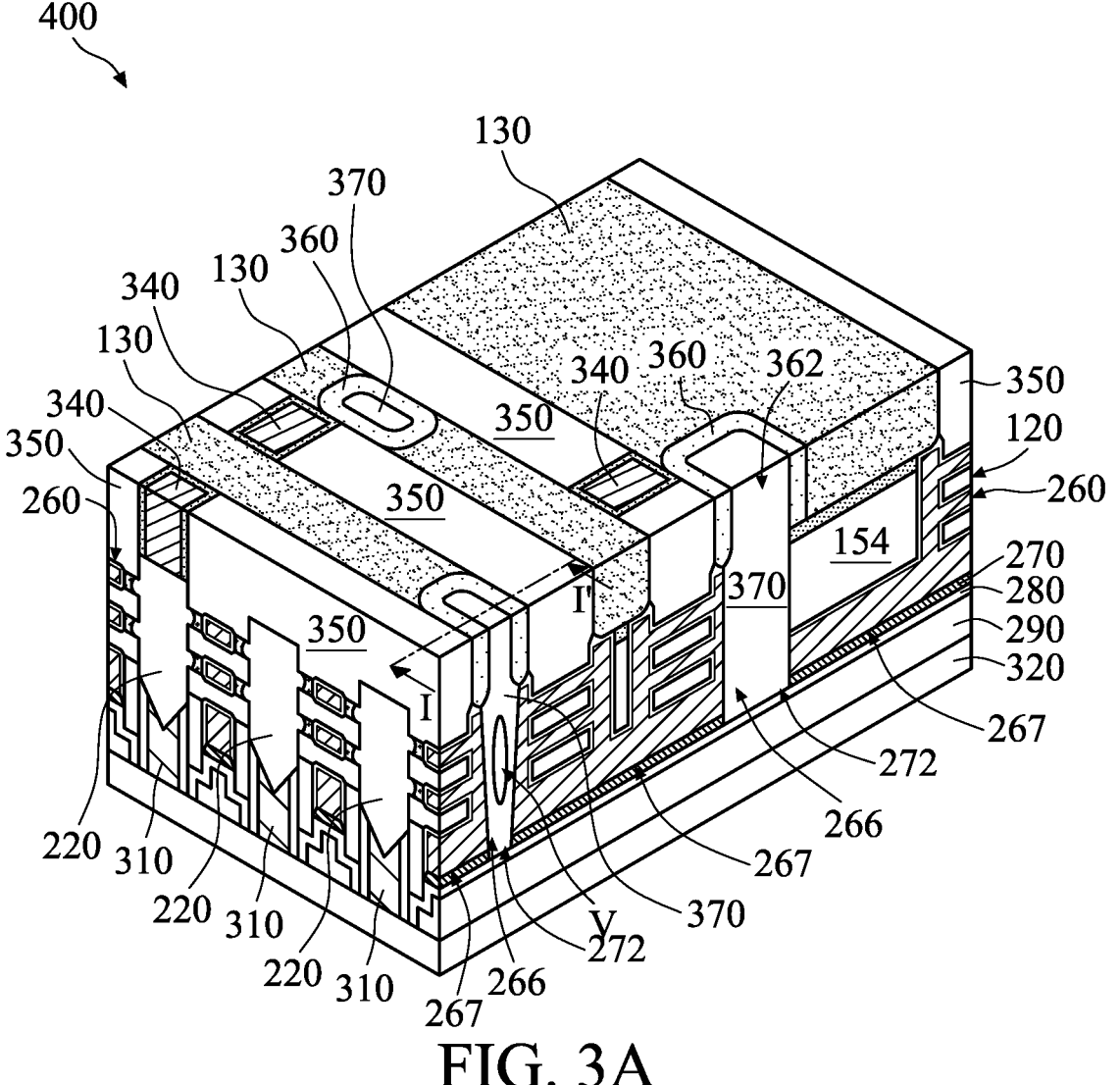
FIG. 3A is a perspective view of a semiconductor device structure, in accordance with some embodiments.
Figure 3B:
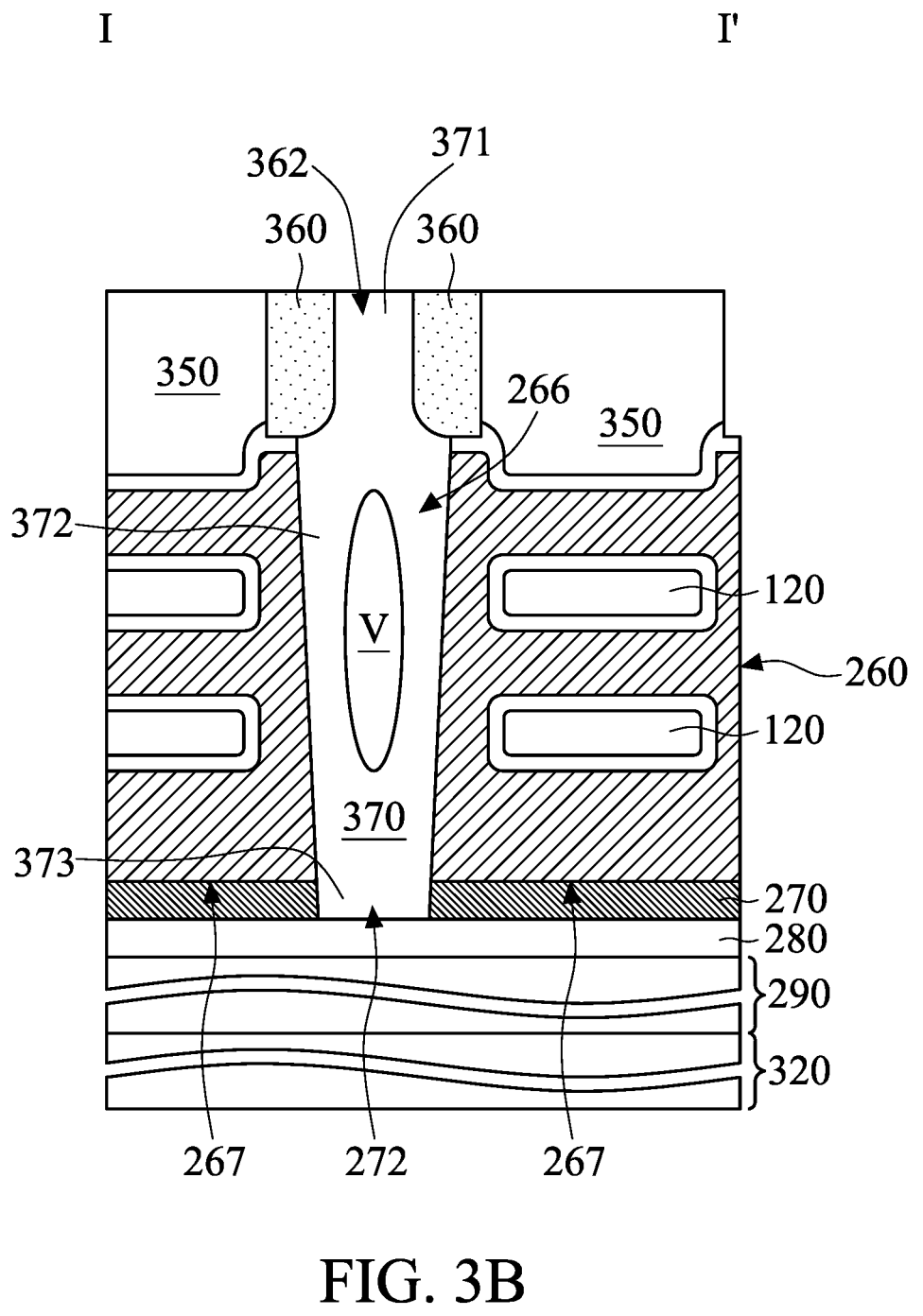

FIG. 3A is a perspective view of a semiconductor device structure 400, in accordance with some embodiments. FIG. 3B is a cross-sectional view illustrating the semiconductor device structure 400 along a sectional line I-I' in FIG. 3A, in accordance with some embodiments. As shown in FIGS. 3A and 3B, the semiconductor device structure 400 is similar to the semiconductor device structure 300 of FIG. 2J, except that the dielectric structure 370 has a void V, in accordance with some embodiments.

The void V is between the parts 267 of the gate stack 260, in accordance with some embodiments. The void V is filled with air, in accordance with some embodiments. Since the dielectric constant of air is low (about 1 F/m), the void V reduces the dielectric constant of the dielectric structure 370, which reduces the parasitic capacitance between the parts 267 of the gate stack 260, in accordance with some embodiments. Therefore, the performance of the semiconductor device structure 400 is improved, in accordance with some embodiments.

Processes and materials for forming the semiconductor device structure 400 may be similar to, or the same as, those for forming the semiconductor device structure 300 described above. Elements designated by the same or similar reference numbers as those in FIGS. 1A to 3B have the same or similar structures and the materials. Therefore, the detailed descriptions thereof will not be repeated herein. The method of the application may be used to form a backside super power rail structure.

In accordance with some embodiments, semiconductor device structures and methods for forming the same are provided. The methods (for forming the semiconductor device structure) remove a portion of a gate stack from a back side of a GAA structure to cut off the gate stack. The removal process removes an isolation structure in a substrate, an isolation fin in the gate stack, and a portion of the gate stack under the isolation fin. Since the portion of the gate stack is thin, it is easy to control the etching process for removing the portion of the gate stack, which prevents the devices under the gate stack from being over-etched. As a result, the yield and the reliability of the semiconductor device structures are improved. Furthermore, the length of the gate stack is reduced by the removal process, which reduces the parasitic capacitance between the gate stack and contact structures.

In accordance with some embodiments, a method for forming a semiconductor device structure is provided. The method includes providing a substrate, a nanostructure, an isolation structure, an isolation fin, and a gate stack. The substrate has a base and a fin over the base, the nanostructure is over the fin, the isolation structure is over the base and surrounds a lower portion of the fin, the isolation fin is over the isolation structure, the gate stack is over the fin, the nanostructure, the isolation fin, and the isolation structure and wrapped around the nanostructure and the isolation fin, and the gate stack has a first surface facing away from the substrate. The method includes turning the substrate upside down and removing the base to expose the isolation structure. The method includes partially removing the isolation structure to form a first trench in the isolation structure. The first trench exposes a portion of the isolation fin. The method includes removing the portion of the isolation fin through the first trench to form a second trench in the gate stack. The method includes partially removing the gate stack through the first trench and the second trench. The second trench passes through the gate stack and divides the gate stack into a first part and a second part.

In accordance with some embodiments, a method for forming a semiconductor device structure is provided. The method includes providing a substrate, a nanostructure, an isolation structure, an isolation fin, and a gate stack. The substrate has a base and a fin over the base, the nanostructure is over the fin, the isolation structure is over the base and surrounds a lower portion of the fin, the isolation fin is over the isolation structure, the gate stack is over the fin, the nanostructure, the isolation fin, and the isolation structure and wrapped around the nanostructure and the isolation fin, and the gate stack has a first surface facing away from the substrate. The method includes turning the substrate upside down and removing the base to expose the isolation structure. The method includes partially removing the isolation structure to form a first trench in the isolation structure. The method includes partially removing the isolation fin through the first trench to form a second trench in the isolation fin. The second trench exposes a portion of the gate stack. The method includes removing the portion of the gate stack through the first trench and the second trench to form a third trench in the gate stack and passing through the gate stack.

In accordance with some embodiments, a semiconductor device structure is provided. The semiconductor device structure includes. The semiconductor device structure includes a first nanostructure and a second nanostructure. The semiconductor device structure includes a first gate stack wrapped around the first nanostructure. The semiconductor device structure includes a second gate stack wrapped around the second nanostructure. The semiconductor device structure includes a dielectric layer over the first gate stack and the second gate stack. The semiconductor device structure includes a dielectric structure passing through the dielectric layer and separating the first gate stack from the second gate stack. The dielectric structure in the dielectric layer is narrower than the dielectric structure between first gate stack and the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

providing a substrate, a nanostructure, an isolation structure, an isolation fin, and a gate stack, wherein the substrate has a base and a fin over the base, the nanostructure is over the fin, the isolation structure is over the base and surrounds a lower portion of the fin, the isolation fin is over the isolation structure, the gate stack is over the fin, the nanostructure, the isolation fin, and the isolation structure and wrapped around the nanostructure and the isolation fin, and the gate stack has a surface facing away from the substrate;

turning the substrate upside down and removing the base to expose the isolation structure;

forming a mask element over the isolation structure after the base is removed, wherein the mask element has an opening extending past opposite sidewalls of the isolation structure and opposite sidewalls of the isolation fin;

partially removing the isolation structure through the opening of the mask element to form a first trench in the isolation structure, wherein the first trench exposes a portion of the isolation fin;

removing the portion of the isolation fin through the first trench to form a second trench in the gate stack; and partially removing the gate stack through the first trench and the second trench, wherein the second trench passes through the gate stack and divides the gate stack into a first part and a second part.

2. The method for forming the semiconductor device structure as claimed in claim 1, further comprising:

forming a dielectric structure in the first trench of the isolation structure and the second trench of the gate stack.

3. The method for forming the semiconductor device structure as claimed in claim 2, wherein a width of the dielectric structure decreases toward the surface of the gate stack.

4. The method for forming the semiconductor device structure as claimed in claim 2, wherein the dielectric structure has a void.

5. The method for forming the semiconductor device structure as claimed in claim 1, further comprising:

after partially removing the gate stack through the first trench and the second trench, partially removing the gate stack from an inner wall of the second trench of the gate stack to widen the second trench.

6. The method for forming the semiconductor device structure as claimed in claim 1, further comprising:

after removing the base and before partially removing the isolation structure, removing the fin to form a recess surrounded by the isolation structure and the gate stack; and forming a dielectric layer in the recess.

7. The method for forming the semiconductor device structure as claimed in claim 6, wherein the first trench in the isolation structure passes through the dielectric layer.

8. The method for forming the semiconductor device structure as claimed in claim 7, further comprising:

after partially removing the isolation structure to form the first trench in the isolation structure and before removing the portion of the isolation fin, forming a spacer layer over an inner wall of the first trench, wherein the spacer layer has an opening exposing the isolation fin, and the spacer layer extends along a sidewall of the dielectric layer.

9. The method for forming the semiconductor device structure as claimed in claim 8, further comprising:

forming a dielectric structure in the opening of the spacer layer and the second trench of the gate stack.

10. The method for forming the semiconductor device structure as claimed in claim 9, wherein the dielectric structure in the opening of the spacer layer is narrower than the dielectric structure in the second trench of the gate stack.

11. A method for forming a semiconductor device structure, comprising:

providing a substrate, a nanostructure, an isolation structure, an isolation fin, and a gate stack, wherein the substrate has a base and a fin over the base, the nanostructure is over the fin, the isolation structure is over the base and surrounds a lower portion of the fin, the isolation fin is over the isolation structure, and the gate stack is over the fin, the nanostructure, the isolation fin, and the isolation structure and wrapped around the nanostructure and the isolation fin;

turning the substrate upside down and removing the base to expose the isolation structure;

forming a mask element over the isolation structure after the base is removed, wherein the isolation structure is between the mask element and the isolation fin, and the mask element has an opening extending past opposite sidewalls of the isolation structure;

partially removing the isolation structure through the opening of the mask element to form a first trench in the isolation structure;

partially removing the isolation fin through the first trench to form a second trench in the isolation fin, wherein the second trench exposes a portion of the gate stack; and removing the portion of the gate stack through the first trench and the second trench to form a third trench in the gate stack and passing through the gate stack.

12. The method for forming the semiconductor device structure as claimed in claim 11, further comprising:

after removing the portion of the gate stack through the first trench and the second trench, partially removing the gate stack from an inner wall of the third trench of the gate stack to widen the third trench.

13. The method for forming the semiconductor device structure as claimed in claim 12, further comprising:

forming a dielectric structure in the first trench of the isolation structure, the second trench of the isolation fin, and the third trench of the gate stack.

14. The method for forming the semiconductor device structure as claimed in claim 11, further comprising:

after partially removing the isolation structure to form the first trench in the isolation structure and before partially removing the isolation fin, forming a first spacer layer over an inner wall of the first trench and a second spacer layer over a sidewall of the mask element, wherein the first spacer layer has an opening exposing the isolation fin.

15. The method for forming the semiconductor device structure as claimed in claim 11, further comprising:

before turning the substrate upside down and removing the base, forming a cap layer over the gate stack; and after removing the portion of the gate stack through the first trench and the second trench to form a third trench in the gate stack and passing through the gate stack, partially removing the cap layer through the first trench, the second trench, and the third trench.

16. A method for forming a semiconductor device structure, comprising:

providing a substrate, an isolation structure, an isolation fin, and a gate stack, wherein the substrate has a base and a fin over the base, the isolation structure is over the base and surrounds a lower portion of the fin, the isolation fin is over the isolation structure, and the gate stack is over the fin, the isolation fin, and the isolation structure and wrapped around the fin and the isolation fin;

turning the substrate upside down and removing the base to expose the isolation structure;

forming a mask element over the isolation structure, wherein a bottom of the mask element is between a top of the mask element and the isolation structure, and the mask element has an opening extending past opposite sidewalls of the isolation fin;

partially removing the isolation structure through the opening of the mask element to form a first trench in the isolation structure and over the isolation fin;

removing the isolation fin through the first trench to form a second trench in the gate stack; and partially removing the gate stack through the first trench and the second trench, wherein the second trench passes through the gate stack and divides the gate stack into a first part and a second part after the gate stack is partially removed.

17. The method for forming the semiconductor device structure as claimed in claim 16, wherein the gate stack has a thick portion and a thin portion, the thin portion is thinner than the thick portion, the thin portion is under the isolation fin, a first top surface of the thick portion is substantially level with a second top surface of the isolation fin after the substrate is turned upside down.

18. The method for forming the semiconductor device structure as claimed in claim 17, wherein the isolation fin comprises a liner layer and a dielectric layer between the liner layer and the thin portion of the gate stack.

19. The method for forming the semiconductor device structure as claimed in claim 18, wherein the dielectric layer is thicker than the liner layer.

20. The method for forming the semiconductor device structure as claimed in claim 16, wherein the isolation fin is narrower than the fin.

* * * * *